United States Patent
Yamada et al.

(10) Patent No.: US 9,754,768 B2
(45) Date of Patent: Sep. 5, 2017

(54) PLASMA PROCESSING METHOD AND PLASMA PROCESSING APPARATUS

(71) Applicant: Tokyo Electron Limited, Tokyo (JP)

(72) Inventors: Norikazu Yamada, Miyagi (JP); Toshifumi Tachikawa, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 248 days.

(21) Appl. No.: 14/363,382

(22) PCT Filed: Dec. 3, 2012

(86) PCT No.: PCT/JP2012/007727
§ 371 (c)(1),
(2) Date: Jun. 6, 2014

(87) PCT Pub. No.: WO2013/084459
PCT Pub. Date: Jun. 13, 2013

(65) Prior Publication Data
US 2014/0305905 A1 Oct. 16, 2014

Related U.S. Application Data

(60) Provisional application No. 61/577,743, filed on Dec. 20, 2011.

(30) Foreign Application Priority Data

Dec. 9, 2011 (JP) .................................. 2011-270356

(51) Int. Cl.
*B44C 1/22* (2006.01)
*H01J 37/32* (2006.01)

(52) U.S. Cl.
CPC .. *H01J 37/32568* (2013.01); *H01J 37/32091* (2013.01); *H01J 37/32146* (2013.01)

(58) Field of Classification Search
CPC ........... H01J 37/32091; H01J 37/32568; H01J 37/32146; B81C 1/00595; H01L 21/3065
(Continued)

(56) References Cited

U.S. PATENT DOCUMENTS

2009/0284156 A1* 11/2009 Banna .................... H01J 37/321
315/111.21
2010/0213162 A1* 8/2010 Mochiki ............. H01J 37/32027
216/17

(Continued)

FOREIGN PATENT DOCUMENTS

| JP | 2009-033080 A | 2/2009 |
| JP | 2009-071292 A | 4/2009 |

(Continued)

OTHER PUBLICATIONS

International Search Report issued in Application No. PCT/JP2012/007727 dated Mar. 5, 2013.

*Primary Examiner* — Binh X Tran
(74) *Attorney, Agent, or Firm* — Pearne & Gordon LLP

(57) ABSTRACT

At a time point $T_0$ when starting a process, a duty ratio of a high frequency power RF1 to which power modulation is performed is set to be an initial value (about 90%) which allows plasma to be ignited securely under any power modulating conditions. At the substantially same time of starting the process, the duty ratio of the high frequency power RF1 is gradually reduced from the initial value (about 90%) in a regular negative gradient or in a ramp waveform. At a time point $t_2$ after a lapse of a preset time $T_d$, the duty ratio has an originally set value $D_s$ for an etching process. After the time point $t_2$, the duty ratio is fixed or maintained (Continued)

at the set value $D_s$ until the end (time point $T_4$) of the process.

10 Claims, 19 Drawing Sheets

(58) Field of Classification Search
USPC .................... 216/71; 438/707, 711, 714, 729
See application file for complete search history.

(56) References Cited

U.S. PATENT DOCUMENTS

| | | | |
|---|---|---|---|
| 2011/0031216 A1* | 2/2011 | Liao .................. | H01J 37/32082 216/67 |
| 2012/0052689 A1* | 3/2012 | Tokashiki ......... | H01J 37/32091 438/714 |

FOREIGN PATENT DOCUMENTS

| | | |
|---|---|---|
| JP | 2010-219491 A | 9/2010 |
| JP | 2011-525682 A | 9/2011 |
| WO | 2009/140371 A2 | 11/2009 |

\* cited by examiner

FIRST RF MODE

RF1

RF2

SECOND RF MODE

RF1

RF2  0

THIRD RF MODE

RF1  0

RF2

FOURTH RF MODE

FIFTH RF MODE

SIXTH RF MODE

SEVENTH RF MODE

FOURTH RF MODE

FIRST DUTY RATIO CONTROL METHOD [4RFM-1]

FOURTH RF MODE

SECOND DUTY RATIO CONTROL METHOD [4RFM-2]

FIFTH RF MODE
FIRST DUTY RATIO CONTROL METHOD [5RFM-1]

FIFTH RF MODE
SECOND DUTY RATIO CONTROL METHOD [5RFM-2]

SIXTH RF MODE
DUTY RATIO CONTROL METHOD [6RFM]

SEVENTH RF MODE
FIRST DUTY RATIO CONTROL METHOD [7RFM-1]

SEVENTH RF MODE
SECOND DUTY RATIO CONTROL METHOD [7RFM-2]

FIFTH RF MODE
SECOND DUTY RATIO CONTROL METHOD [5RFM-2]

FIG. 9A

| PULSE FREQUENCY [Hz] \ DUTY RATIO [%] | 10 | 20 | 30 | 40 | 50 | 60 | 70 | 80 | 90 |
|---|---|---|---|---|---|---|---|---|---|
| 5k | OK | OK | OK | OK | OK | OK | OK | OK | OK |
| 10k | OK | OK | OK | OK | OK | OK | OK | OK | OK |
| 20k |  | OK | OK | OK | OK | OK | OK | OK | OK |
| 30k |  |  | OK | OK | OK | OK | OK | OK | OK |
| 40k |  |  |  | NG | NG | NG | NG | NG | OK |
| 50k |  |  |  |  | OK | OK | NG | NG | OK |
| 60k |  |  |  |  |  | NG | NG | OK | OK |
| 70k |  |  |  |  |  |  | NG | OK | OK |
| 80k |  |  |  |  |  |  |  | OK | OK |
| 90k |  |  |  |  |  |  |  |  | OK |
| 100k |  |  |  |  |  |  |  |  |  |

FIG. 9B

| PULSE FREQUENCY [Hz] \ DUTY RATIO [%] | 10 | 20 | 30 | 40 | 50 | 60 | 70 | 80 | 90 |
|---|---|---|---|---|---|---|---|---|---|
| 5k | OK | OK | OK | OK | OK | OK | OK | OK | OK |
| 10k | OK | OK | OK | OK | OK | OK | OK | OK | OK |
| 20k |  | OK | OK | OK | OK | OK | OK | OK | OK |
| 30k |  |  | OK | OK | OK | OK | OK | OK | OK |
| 40k |  |  |  | 1.0s | 1.0s | 1.0s | 1.0s | 1.0s | OK |
| 50k |  |  |  |  | OK | OK | 1.0s | 1.0s | OK |
| 60k |  |  |  |  |  | 1.0s | 1.0s | OK | OK |
| 70k |  |  |  |  |  |  | 1.0s | OK | OK |
| 80k |  |  |  |  |  |  |  | OK | OK |
| 90k |  |  |  |  |  |  |  |  | OK |
| 100k |  |  |  |  |  |  |  |  |  |

FIG. 10A

| | DUTY RATIO [%] | | | | | | | | |
|---|---|---|---|---|---|---|---|---|---|
| PULSE FREQUENCY [Hz] | 10 | 20 | 30 | 40 | 50 | 60 | 70 | 80 | 90 |
| 5k | NG | NG | OK | OK | OK | OK | OK | OK | OK |
| 10k | NG | OK | OK | OK | OK | OK | OK | OK | OK |
| 20k | | NG | NG | NG | NG | OK | OK | OK | OK |
| 30k | | | NG | OK | OK | OK | OK | OK | OK |
| 40k | | | | OK | OK | OK | OK | OK | OK |
| 50k | | | | | OK | OK | OK | OK | OK |
| 60k | | | | | | OK | OK | OK | OK |
| 70k | | | | | | | OK | OK | OK |
| 80k | | | | | | | | OK | OK |
| 90k | | | | | | | | | OK |
| 100k | | | | | | | | | |

FIG. 10B

| | DUTY RATIO [%] | | | | | | | | |
|---|---|---|---|---|---|---|---|---|---|
| PULSE FREQUENCY [Hz] | 10 | 20 | 30 | 40 | 50 | 60 | 70 | 80 | 90 |
| 5k | 2.5s | 2.5s | OK | OK | OK | OK | OK | OK | OK |
| 10k | 1.5s | OK | OK | OK | OK | OK | OK | OK | OK |
| 20k | | 1.0s | 1.0s | 1.0s | 1.0s | OK | OK | OK | OK |
| 30k | | | 1.0s | OK | OK | OK | OK | OK | OK |
| 40k | | | | OK | OK | OK | OK | OK | OK |
| 50k | | | | | OK | OK | OK | OK | OK |
| 60k | | | | | | OK | OK | OK | OK |
| 70k | | | | | | | OK | OK | OK |
| 80k | | | | | | | | OK | OK |
| 90k | | | | | | | | | OK |
| 100k | | | | | | | | | |

[COMPARATIVE EXAMPLE]

EIGHTH RF MODE

EIGHTH RF MODE

EIGHTH RF MODE
FIRST DUTY RATIO CONTROL METHOD [8RFM-1]

EIGHTH RF MODE
SECOND DUTY RATIO CONTROL METHOD [8RFM-2]

PLASMA PROCESSING METHOD AND PLASMA PROCESSING APPARATUS

CROSS-REFERENCE TO RELATED APPLICATION

This Application is a U.S. national phase application under 35 U.S.C. §371 of PCT Application No. PCT/JP2012/007727 filed on Dec. 3, 2012, which claims the benefit of Japanese Patent Application No. 2011-270356 filed on Dec. 9, 2011, and U.S. Provisional Application Ser. No. 61/577,743 filed on Dec. 20, 2011, the entire disclosures of which are incorporated herein by reference.

TECHNICAL FIELD

The embodiments described herein pertain generally to a technique of performing a plasma process on a processing target substrate; and, more particularly, the embodiments pertain to a capacitively coupled plasma processing apparatus and a plasma processing method in which a high frequency power for plasma generation is modulated in a pulse shape.

BACKGROUND ART

A capacitively coupled plasma processing apparatus includes an upper electrode and a lower electrode arranged in parallel to each other within a processing vessel. A processing target substrate (e.g., a semiconductor wafer, a glass substrate, etc) is mounted on the lower electrode, and a high frequency power having a frequency (typically, about 13.56 MHz or higher) suitable for plasma generation is applied to the upper electrode or the lower electrode. Electrons are accelerated by a high frequency field generated between the two facing electrodes by applying the high frequency power, and plasma is generated as a result of ionization by collision between the electrons and a processing gas. Through a gas phase reaction or a surface reaction of radicals or ions included in the plasma, a thin film is formed on the substrate, or a material or a thin film on a surface of the substrate is etched.

Recently, as a design rule is getting more miniaturized in a manufacturing process of a semiconductor device or the like, higher level of dimensional accuracy is required in, especially, plasma etching. Further, it is required to increase etching selectivity against a mask or an underlying film and to improve etching uniformity in the entire surface of a substrate. For this reason, pressure and ion energy in a processing region within a chamber tends to be reduced, and a high frequency power having a high frequency equal to or higher than about 40 MHz is used.

However, as the pressure and the ion energy are reduced, an influence of a charging damage, which has been negligible conventionally, can be no more neglected. That is, in a conventional plasma processing apparatus having high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

To solve this problem, using a power modulation process of modulating a high frequency power for plasma generation in an on/off (or H level/L level) pulse shape is considered to be effective (Patent Document 1). According to this power modulation process, a plasma generation state in which plasma of a processing gas is being generated and a plasma non-generation state in which plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. Accordingly, the amount of electric charges introduced into a processing target substrate from the plasma at one time or the amount of electric charges accumulated on the surface of the processing target substrate may be reduced, so that the charging damage is suppressed from being generated. Therefore, a stable plasma process can be performed and reliability of the plasma process can be improved.

Further, in the capacitively coupled plasma processing apparatus, a RF bias method is widely employed. In this RF bias method, a high frequency power having a relatively low frequency (typically, about 13.56 MHz or lower) is applied to the lower electrode on which the substrate is mounted, and ions in the plasma are accelerated and attracted to the substrate by a negative bias voltage or a sheath voltage generated on the lower electrode. In this way, by accelerating the ions in the plasma and bringing them into collision with the surface of the substrate, a surface reaction, anisotropic etching or modification of a film may be facilitated.

However, when performing the etching process to form via holes or contact holes by using the capacitively coupled plasma etching apparatus, a so-called micro-loading effect may occur. That is, an etching rate may differ depending on the hole size, so that it is difficult to control an etching depth. Especially, the etching rate tends to be higher at a large area such as a guide ring (GR), whereas the etching rate tends to be lower at a small via in which CF-based radicals are difficult to be introduced.

To solve this problem, a power modulation process of modulating a high frequency power for ion attraction in a first level/second level (or on/off) pulse shape and varying the duty ratio thereof is deemed to be effective (see, for example, Patent Document 2). According to this power modulation process, a period of maintaining a high power of the first level (H level) suitable for etching a preset film on the processing target substrate and a period of maintaining a low power of the second level (L level) as a high frequency power for ion attraction suitable for depositing polymer on a preset film on the processing target substrate are alternately repeated at a certain cycle. Accordingly, at an area having a larger hole size, a proper polymer layer may be deposited on the preset film at a higher deposition rate, so that the etching may be suppressed. Thus, an undesirable micro-loading effect may be reduced, and it may be possible to perform an etching process with a high selectivity and a high etching rate.

Further, in the capacitively coupled plasma etching apparatus, an organic mask having a low etching resistance, such as ArF photoresist, may be modified by applying a negative DC voltage to the upper electrode facing the substrate with a plasma generation space therebetween and attracting secondary electrons generated in the upper electrode into a surface layer of the substrate at a high speed. Recently, in order to improve the effect of modifying the organic mask by the high-speed electrons, there has been proposed a method of turning on and off a high frequency power for plasma generation with a regular pulse frequency and, synchronously, applying a DC voltage only during a period when the high frequency power is off (see, for example, Patent Document 3). As in this method, by applying the DC voltage to the upper electrode during a period when the high frequency power is turned off and, thus, a plasma sheath is thinned, the secondary electrons from the upper electrode may reach the substrate efficiently, so that the organic film on the substrate can be enhanced.

REFERENCES

Patent Document 1: Japanese Patent Laid-open Publication No. 2009-071292
Patent Document 2: Japanese Patent Laid-open Publication No. 2009-033080
Patent Document 2: Japanese Patent Laid-open Publication No. 2010-219491

DISCLOSURE OF THE INVENTION

Problems to be Solved by the Invention

In the conventional capacitively coupled plasma processing apparatus having the power modulation function as described above, both a pulse frequency and a duty ratio (a ratio of an on-period within a single cycle of a pulse) among plasma process recipes can be set as required. If the duty ratio is set to be low or the pulse frequency is set to be high in the power modulation of the high frequency power for plasma generation, it may be difficult to ignite plasma at the beginning of the process.

To solve this problem, conventionally, the process is started by igniting the plasma under an especially high pressure condition or a high RF power condition suitable for a high frequency discharge. Then, after the high frequency discharge is stabilized, the pressure or the RF power is switched into a preset pressure or a preset RF power. In this method, however, since conditions different from the preset processing conditions are used for a certain time period, an adverse effect on the plasma process may be caused, so that reliability of the process may be deteriorated.

In view of the foregoing problems, example embodiments provide a plasma processing method and a plasma processing apparatus capable of stably and securely starting a plasma process under preset processing conditions by igniting plasma securely even if a duty ratio is set to be any specific value (especially, low) or a pulse frequency is set to be any specific value (especially, high) in the power modulation process of modulating a high frequency power for plasma generation in a pulse shape.

Means for Solving the Problems

In one example embodiment, a plasma processing method generates plasma by a high frequency discharge of a processing gas between a first electrode and a second electrode which are provided to face each other within an evacuable processing vessel that accommodates therein a substrate to be processed, which is loaded into or unloaded from the processing vessel, and performs a plasma process on the substrate held on the first electrode under the plasma. The plasma processing method includes performing a power modulation on a first high frequency power for plasma generation in a pulse shape such that a first period during which the first high frequency power is turned on or set to be a first level and a second period during which the first high frequency power is turned off or set to be a second level lower than the first level are alternately repeated at a regular pulse frequency in the plasma process; and setting a duty ratio in the power modulation of the first high frequency power to be an initial value for plasma ignition, and then, reducing the duty ratio from the initial value to a set value for the plasma process gradually or in a step shape during a preset transition time.

In another example embodiment, a plasma processing apparatus includes an evacuable processing vessel; a first electrode configured to support a substrate to be processed within the processing vessel; a second electrode provided to face the first electrode within the processing vessel; a processing gas supply unit configured to supply a processing gas into the processing vessel; a first high frequency power feed unit configured to apply a first high frequency power to either one of the first electrode and the second electrode to generate plasma of the processing gas within the processing vessel; a modulation controller configured to control the first high frequency power feed unit to perform a power modulation on the first high frequency power in a plasma process such that a first period during which the first high frequency power for plasma generation is turned on or set to be a first level and a second period during which the first high frequency power is turned off or set to be a second level lower than the first level are alternately repeated at a regular pulse frequency; and a duty ratio controller configured to set a duty ratio in the power modulation of the first high frequency power to be an initial value for plasma ignition, and then, reduce the duty ratio from the initial value to a preset value for the plasma process gradually or in a step shape during a preset transition time.

Effect of the Invention

In accordance with the plasma processing apparatus and the plasma processing method of the example embodiments, it is possible to start a plasma process under preset processing conditions stably and securely by igniting plasma securely even when a duty ratio or a pulse frequency is set to be any specific value in the power modulation of modulating a high frequency power for plasma generation to a pulse shape.

BRIEF DESCRIPTION OF THE DRAWINGS

FIG. 9A is a diagram showing an experiment result regarding plasma ignition property when using the second duty ratio control method in the fifth RF mode.

FIG. 9B is a diagram showing an experiment result regarding plasma ignition property when applying the first duty ratio control method under the processing conditions of "NG" in the above experiment using the second duty ratio control method.

FIG. 10A is a diagram showing another experiment result regarding plasma ignition property when using the second duty ratio control method in the fifth RF mode.

FIG. 10B is a diagram showing an experiment result regarding plasma ignition property when applying the first duty ratio control method under the processing conditions of "NG" in the above experiment using the second duty ratio control method.

MODE FOR CARRYING OUT THE INVENTION

In the following, example embodiments will be described, and reference is made to the accompanying drawings, which form a part of the description.

Figure 1:
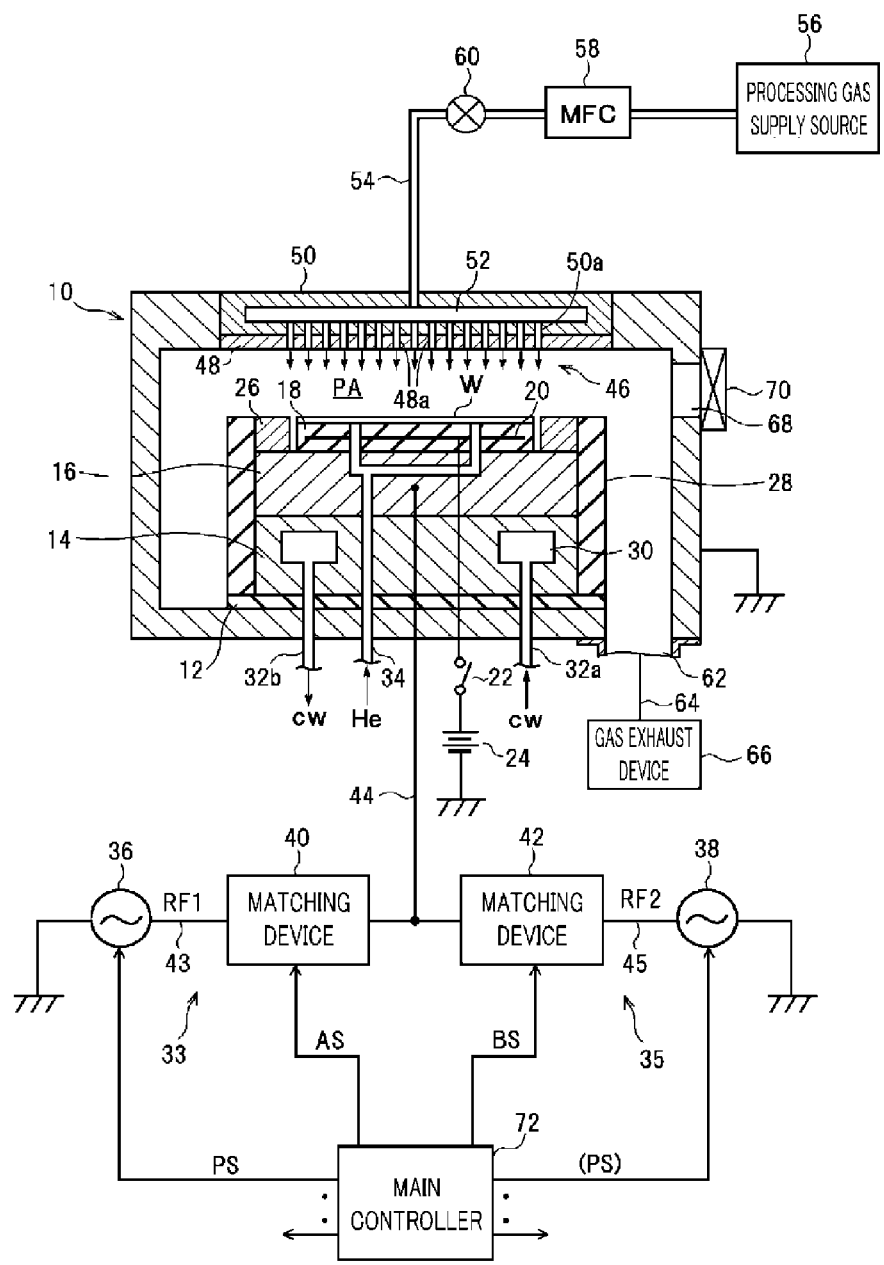
FIG. 1 is cross sectional view illustrating a configuration of a plasma processing apparatus in accordance with a first example embodiment.

FIG. 1 is a diagram illustrating a configuration of a plasma processing apparatus in accordance with a first example embodiment. The plasma processing apparatus is configured as a capacitively coupled (parallel plate type) plasma etching apparatus. By way of example, the plasma processing apparatus includes a cylindrical vacuum chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target substrate, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

Dual frequency power feed units 33 and 35 are electrically connected to the susceptor 16. The first high frequency power feed unit 33 includes a high frequency power supply 36 configured to output a high frequency power RF1 of a certain frequency $f_{RF1}$ (e.g., about 100 MHz) suitable for plasma generation; a high frequency transmission line 43 configured to transmit the high frequency power RF1 outputted from the high frequency power supply 36 to the susceptor 16; and a matching device 40 provided on the high frequency transmission line 43. The second high frequency power feed unit 35 includes a high frequency power supply 38 configured to output a high frequency power RF2 of a certain frequency $f_{RF2}$ (e.g., about 13.56 MHz) suitable for ion attraction from plasma into the semiconductor wafer W on the susceptor 16; a high frequency transmission line 45 configured to transmit the high frequency power RF2 outputted from the high frequency power supply 38 to the susceptor 16; and a matching device 42 provided on the high frequency transmission line 45. A power supply conductor (e.g., a power supply rod) 44 connected to a rear surface (bottom surface) of the susceptor 16 is shared by the two high frequency transmission lines 43 and 45.

An upper electrode 46 having a ground potential is provided at a ceiling of the chamber 10, facing the susceptor 16 in parallel. The upper electrode 46 includes an electrode plate 48 having a multiple number of gas discharge holes 48a and made of, e.g., a silicon-containing material such as Si or SiC; and an electrode supporting body 50 detachably supporting the electrode plate 48 and made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The gas supply line 54 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed in a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main controller 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, etc., according to software (program) and recipes stored in an external memory or an internal memory.

Further, the main controller 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main controller 72 is configured as a single control unit. However, it may be also possible to adopt a configuration in which multiple control units divide up the functions of the main controller 72 individually or hierarchically.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, a high frequency power RF1 (about 100 MHz) from the high frequency power supply 36 and a high frequency power RF2 (about 13.56 MHz) from the high frequency power supply 38 are applied to the susceptor 16, overlapped with each other (or separately). Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is discharged under a high frequency electric field between the two electrodes 46 and 16, so that plasma is generated in the processing space PA. An etching target film on a main surface of the semiconductor wafer W is etched by radicals or ions included in the plasma.

In the capacitively coupled plasma etching apparatus, as for the kinds, forms, and combinations of the high frequency powers applied to the susceptor 16 within the chamber 10, the following seven types of RF modes may be selectively used under the control of the main controller 72 upon the high frequency power feed units 33 and 35. Among the seven types of RF modes, in a first RF mode to a third RF mode, the power modulation is not used, whereas in a fourth RF mode to a seventh RF mode, the power modulation is used.

Figure 2A:
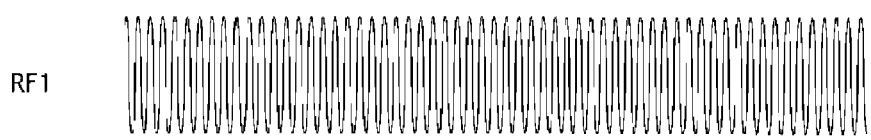
FIG. 2A is a diagram showing a first RF mode regarding various waveforms and combinations of two high frequency powers applicable to the plasma processing apparatus.
Figure 2A:
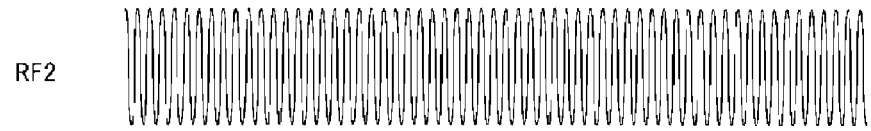

As depicted in FIG. 2A, the first RF mode is of a typical dual frequency application type that applies dual frequency powers to the lower electrode. In this first RF mode, the high frequency power RF1 of a frequency (e.g., about 100 MHz) in the high frequency power feed unit 33 is set as a continuous wave CW of a constant power, and the high frequency power RF2 of a frequency (e.g., about 13.56 MHz) in the high frequency power feed unit 35 is set as a continuous wave CW of a constant power. In this case, the high frequency power RF1 may dominantly work for or contribute to plasma generation, whereas the high frequency power RF2 may dominantly work for or contribute to ion attraction from the plasma into the semiconductor wafer W on the susceptor 16.

Figure 2B:
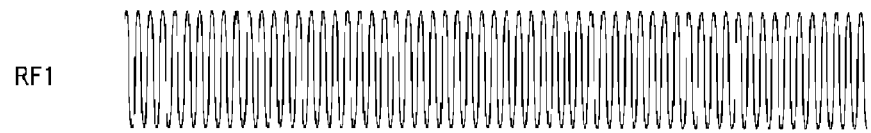
FIG. 2B is a diagram showing a second RF mode in the plasma processing apparatus.
Figure 2B:
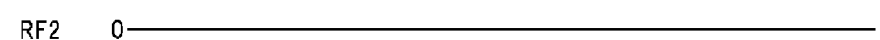

As depicted in FIG. 2B, in the second RF mode, the high frequency power RF1 of the high frequency power feed unit 33 is set as a continuous wave CW of a constant power, and the high frequency power RF2 of the high frequency power feed unit 35 is maintained off constantly. In this case, the high frequency power RF1 may not only work for plasma generation but also work for ion attraction, though the effect on the ion attraction is not as high as that of the high frequency power RF2.

Figure 2C:
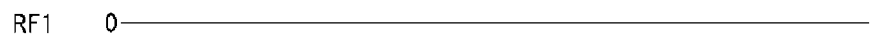
FIG. 2C is a diagram showing a third RF mode in the plasma processing apparatus.
Figure 2C:
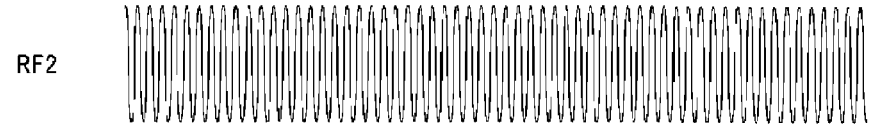

Referring to FIG. 2C, in the third RF mode, the high frequency power RF1 of the high frequency power feed unit 33 is maintained off constantly, and the high frequency power RF2 of the high frequency power feed unit 35 is set as a continuous wave CW of a constant power. In this case, the high frequency power RF2 may not only work for ion attraction but also work for plasma generation, though the effect on the electric discharge is not as high as that of the high frequency power RF1.

Figure 3A:
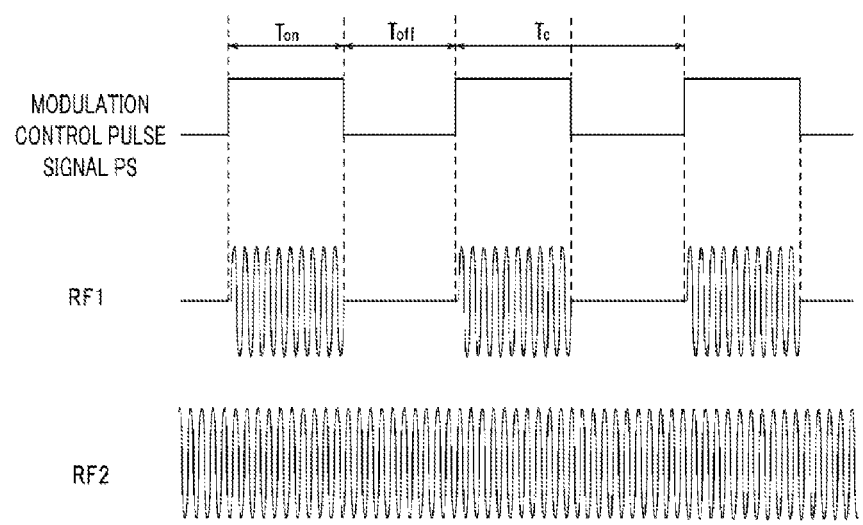
FIG. 3A is a diagram showing a fourth RF mode in the plasma processing apparatus.

FIG. 3A depicts the fourth RF mode. In the fourth RF mode, the high frequency power RF1 of the high frequency power feed unit 33 is set to have a pulse waveform through power modulation, and the high frequency power RF2 of the high frequency power feed unit 35 is set as a continuous wave CW of a constant power. In this case, the high frequency power RF1 may dominantly work for plasma generation, whereas the high frequency power RF2 may dominantly work for ion attraction.

Figure 3B:
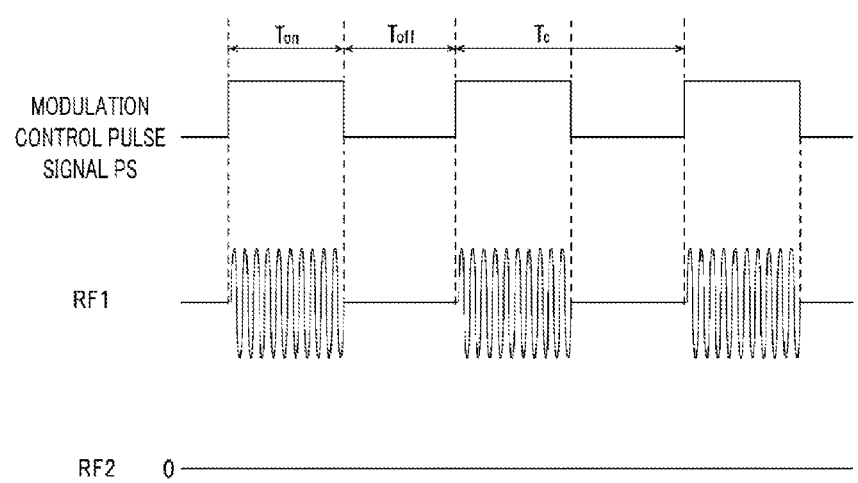
FIG. 3B is a diagram showing a fifth RF mode in the plasma processing apparatus.

Referring to FIG. 3B, in the fifth RF mode, the high frequency power RF1 of the high frequency power feed unit 33 is set to have a pulse waveform through power modulation, and the high frequency power RF2 of the high frequency power feed unit 35 is maintained off constantly. In this case, the high frequency power RF1 may not only work for plasma generation but also work for ion attraction, through the effect on the ion attraction is not as high as that of the high frequency power RF2.

Figure 3C:
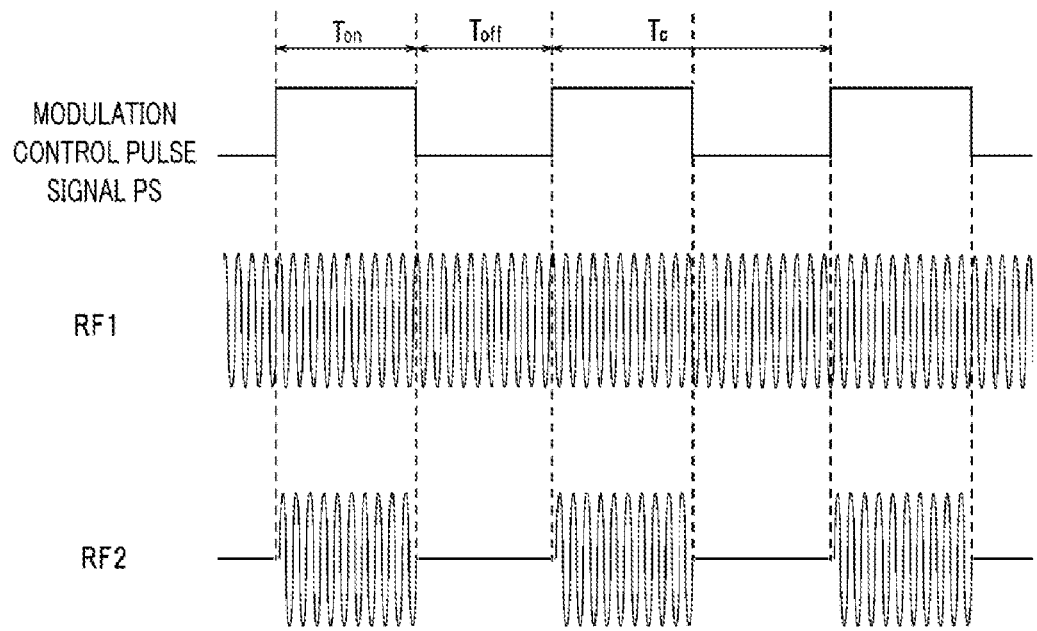
FIG. 3C is a diagram showing a sixth RF mode in the plasma processing apparatus.

Referring to FIG. 3C, in the sixth RF mode, the high frequency power RF1 of the high frequency power feed unit 33 is set as a continuous wave CW of a constant power, and the high frequency power RF2 of the high frequency power feed unit 35 is set to have a pulse waveform through power modulation. In this case, the high frequency power RF1 may dominantly work for plasma generation, whereas the high frequency power RF2 may dominantly work for ion attraction.

Figure 3D:
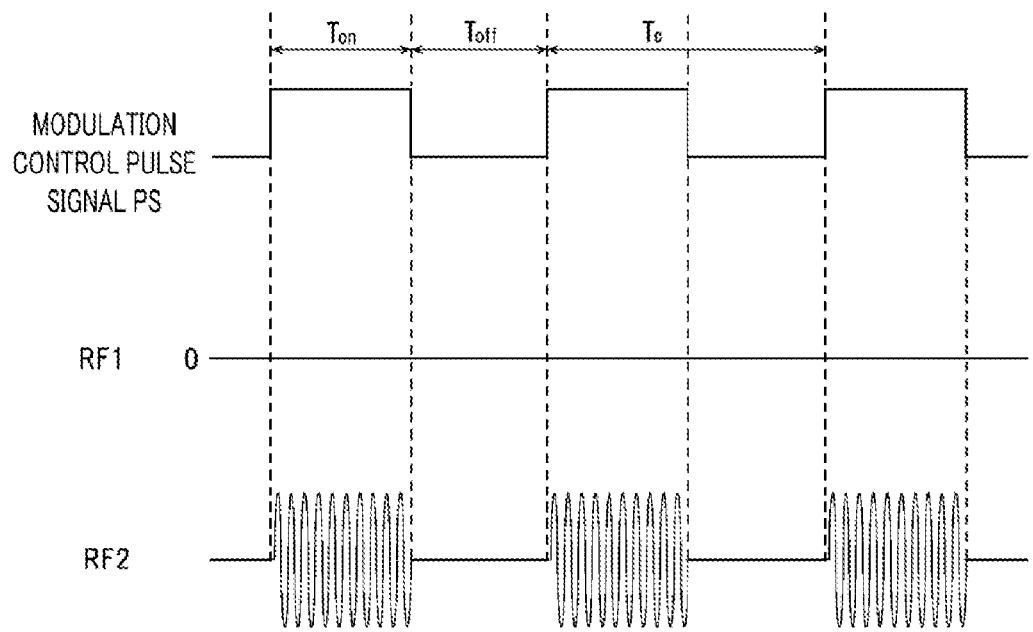
FIG. 3D is a diagram showing a seventh RF mode in the plasma processing apparatus.

Lastly, in the seventh RF mode as depicted in FIG. 3D, the high frequency power RF1 of the high frequency power feed unit 33 is maintained off constantly, and the high frequency power RF2 of the high frequency power feed unit 35 is set to have a pulse waveform through power modulation. In this case, the high frequency power RF2 may not only work for ion attraction but also work for plasma generation, through the effect on the electric discharge is not as high as that of the high frequency power RF1.

In the power modulation according to the present example embodiment, as shown in FIG. 3A to FIG. 3D, an on-period (first period) $T_{on}$ during which the high frequency power RF1 (RF2) is maintained on and an off-period (second period) $T_{off}$ during which the high frequency power RF1 (RF2) is maintained off are alternately repeated at a regular pulse frequency or cycle $T_C$. The RF power during the on-period is set to be constant. The main controller 72 may output a modulation control pulse signal PS for determining a pulse frequency and a duty ratio of power modulation to the high frequency power supply 36 (38). Here, if set values of the pulse frequency and the duty ratio are defined as $f_s$ and $D_s$, respectively, equations of $T_C=1/f_S$, $T_C=T_{on}+T_{off}$, $D_s=T_{on}/(T_{on}+T_{off})$ are established.

(Duty Ratio Control Method for Power Modulation in First Example Embodiment)

Now, referring to FIG. 4A to FIG. 7B, a duty ratio control of the power modulation in the fourth RF mode to the seventh RF mode will be discussed. The duty ratio control may be performed as one of control operations performed by the main controller 72 upon the high frequency power feed units 33 and 35 based on the recipes or other conditions set through the manipulation panel, for example. That is, in the first example embodiment, the main controller 72 serves as a duty ratio control unit.

Figure 4A:
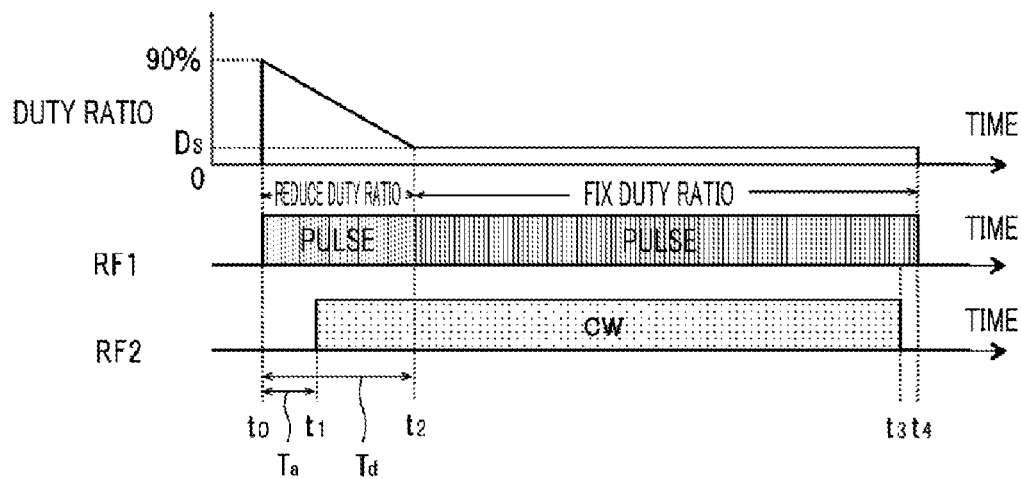
FIG. 4A is a diagram showing a first duty ratio control method in the fourth RF mode.
Figure 4B:
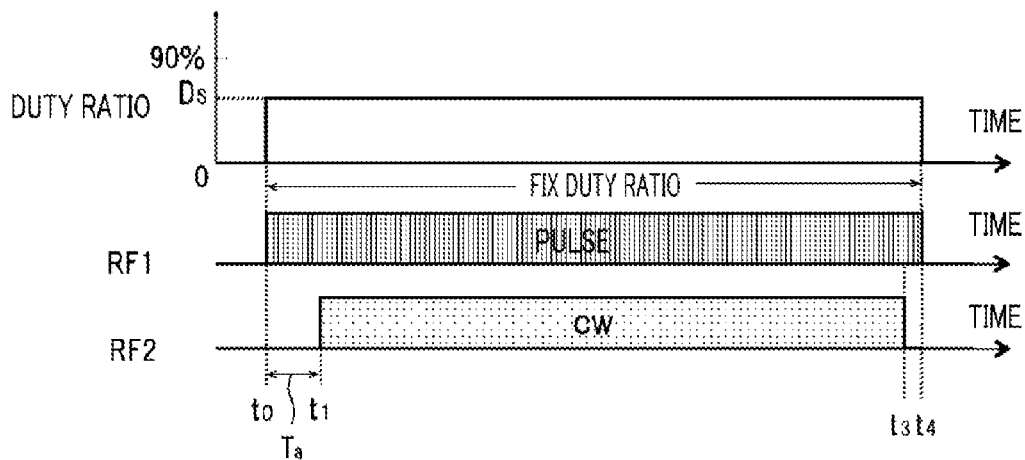
FIG. 4B is a diagram showing a second duty ratio control method in the fourth RF mode.

In the fourth RF mode (FIG. 3A), two types of duty ratio control methods [4RFM-1, 4RFM-2] may be selectively used. As shown in FIG. 4A and FIG. 4B, in the fourth RF mode, when starting a process, the high frequency power RF1 (high frequency power feed unit 33) for plasma generation is first driven at a time point $t_0$. Then, at a time point $T_1$ after a lapse of a certain time $T_a$, the high frequency power RF2 (high frequency power feed unit 35) for ion attraction is driven. Desirably, the elapsed time $T_a$ may be set to be of a value (e.g., about 0.4 sec to about 0.8 sec) larger than a time (typically, about 0.2 sec to about 0.5 sec) taken before plasma is ignited after the application of the high frequency power RF1 is started.

Here, in the first duty ratio control method [4RFM-1], as shown in FIG. 4A, at the time point $T_0$ when starting the process, a duty ratio of the high frequency power RF1 to which the power modulation is performed is set to be an initial value (in this experimental example, about 90%) which allows plasma to be ignited securely under any power modulating conditions (particularly, a duty ratio and a pulse frequency). It may be desirable that the initial value is as close to an originally set value $D_s$ of the duty ratio for the etching process as possible. That is, desirably, the initial value may be a value (typically, about 85% to about 95%) close to a lower limit within a duty ratio range in which plasma can be ignited securely under the power modulating conditions.

At the substantially same time of starting the process, the duty ratio of the high frequency power RF1 is gradually reduced from the initial value (about 90%) in a regular negative gradient or in a ramp waveform. At a time point $t_2$ after a lapse of a preset time $T_d$ ($T_d > T_a$), the duty ratio has the originally set value $D_S$ for the etching process. After the time point $t_2$, the duty ratio is fixed or maintained at the set value $D_S$ until the end (time point $T_4$) of the process. Further, when using the high frequency powers RF1 and RF2 in combination (i.e., when applying them while overlapping them), the high frequency power RF2 for ion attraction is stopped (at a time point $t_3$) slightly before the end of the process. This first duty ratio control method [4RFM-1] may be effective when plasma is difficult to be ignited in the fourth RF mode, e.g., when the duty ratio $D_s$ is set to be low or a pulse frequency $f_S$ is set to be high.

In the second duty ratio control method [4RFM-2], the duty ratio of the high frequency power RF1 has the originally set value $D_S$ from the beginning ($t_0$) of the process to the end ($t_4$) of the process, as shown in FIG. 4B. This duty ratio control method [4RFM-2] may be appropriately used in case that it is possible to ignite plasma securely under the duty ratio $D_s$ and the pulse frequency $f_s$ of the power modulation performed in the etching process.

Figure 5A:
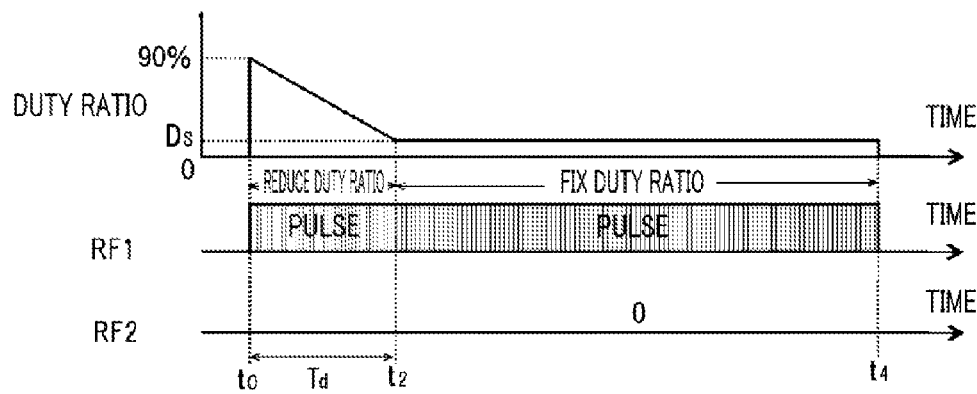
FIG. 5A is a diagram showing a first duty ratio control method in the fifth RF mode.
Figure 5B:
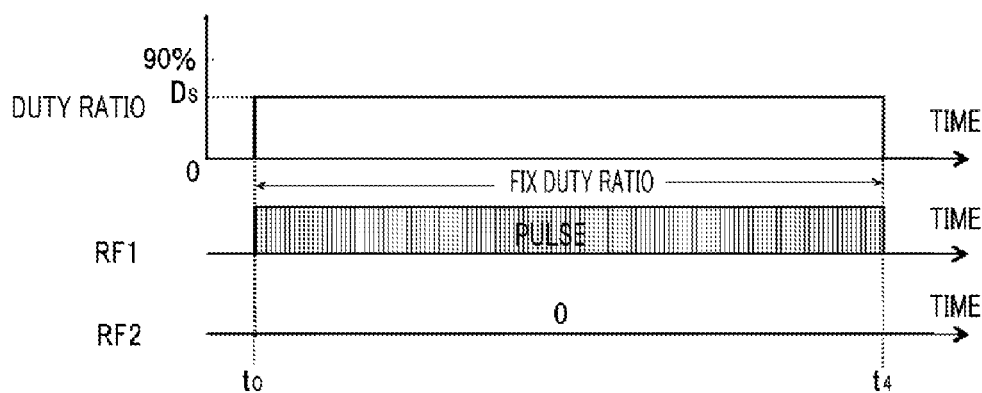
FIG. 5B is a diagram showing a second duty ratio control method in the fifth RF mode.

In the fifth RF mode (FIG. 3B), two types of duty ratio control methods [5RFM-1, 5RFM-2] may be selectively used. As shown in FIG. 5A and FIG. 5B, in the fifth RF mode, when the process is started, the high frequency power RF1 (high frequency power feed unit 33) for both plasma generation and ion attraction is first driven at a time point $t_0$.

Here, the first duty ratio control method [5RFM-1] has the same sequence as that of the first duty ratio control method [4RFM-1] in the above-described fourth RF mode. That is, as shown in FIG. 5A, at a time point $T_0$ when starting the process, a duty ratio of the high frequency power RF1 to which the power modulation is performed is set to be an initial value (in this experimental example, about 90%) which allows plasma to be ignited securely under any power modulating conditions (particularly, a duty ratio and a pulse frequency). Then, at the substantially same time of starting the process, the duty ratio of the high frequency power RF1 is gradually reduced from the initial value (about 90%) in a regular negative gradient or in a ramp waveform. At a time point $t_2$ after a lapse of a preset time $T_d$, the duty ratio has an originally set value $D_s$ for the etching process. After the time point $t_2$, the duty ratio of the high frequency power RF1 is fixed at the set value $D_s$ until the end (time point $T_4$) of the process. This first duty ratio control method [5RFM-1] may be effective when plasma is difficult to be ignited in the fifth RF mode, for example, when the duty ratio $D_s$ is set to be low or a pulse frequency $f_S$ is set to be high.

The second duty ratio control method [5RFM-2] in the fifth RF mode has the same sequence as that of the second duty ratio control method [4RFM-2] in the fourth RF mode. That is, as depicted in FIG. 5B, the duty ratio of the high frequency power RF1 has the originally set value $D_s$ from the beginning ($t_0$) of the process to the end ($t_4$) of the process. This duty ratio control method [5RFM-2] may be appropriately used when it is possible to ignite plasma securely under the duty ratio $D_s$ and the pulse frequency $f_s$ of the power modulation performed in the etching process.

Figure 6:
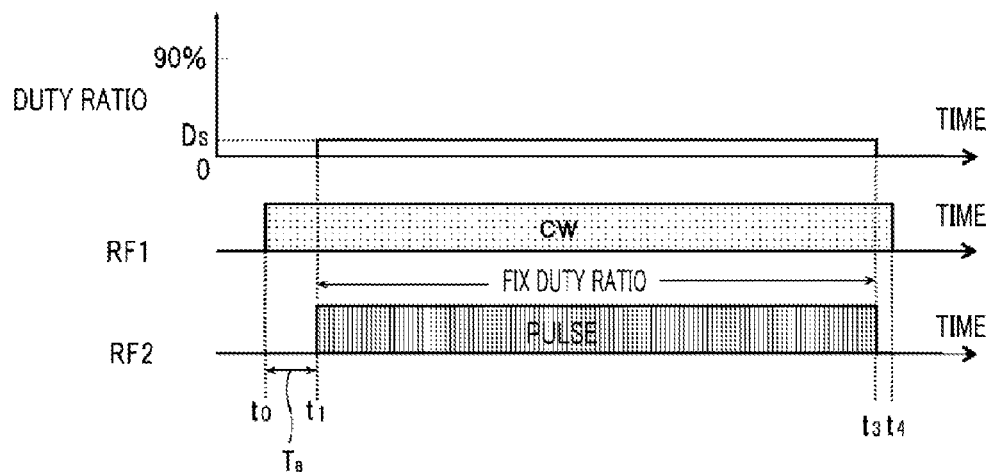
FIG. 6 is a diagram showing a duty ratio control method in the sixth RF mode.

In the sixth RF mode (FIG. 3C), a single kind of duty ratio control method is used. As shown in FIG. 6, in the sixth RF mode, when starting the process, the high frequency power RF1 (high frequency power feed unit 33) for plasma generation is first driven at a time point $t_0$, and the high frequency power RF2 (high frequency power feed unit 35) for ion attraction is driven at a time point $t_1$ after a lapse of a certain time $T_a$. In this case, since the high frequency power RF1 is a continuous wave CW having a duty ratio equivalent to about 100%, plasma may be securely ignited within the chamber 10 regardless of the values of the duty ratio $D_s$ and the pulse frequency $f_s$ of the power modulation on the high frequency power RF2, as long as a pressure or a power of RF1 is set to be a typical value.

Accordingly, in the duty ratio control method of the sixth RF mode, the duty ratio of the high frequency power RF2 has the set value $D_s$ from the time point $t_1$ when driving the high frequency power RF2 (high frequency power feed unit 35) to the end ($t_3$) of the process.

In the seventh RF mode (FIG. 3D), two types of duty ratio control methods [7RFM-1, 7RFM-2] may be selectively used. In the seventh RF mode, as shown in FIG. 7A and FIG. 7B, when starting a process, the high frequency power RF2 (high frequency power feed unit 35) for both plasma generation and ion attraction is driven at a time point $t_0$.

Figure 7A:
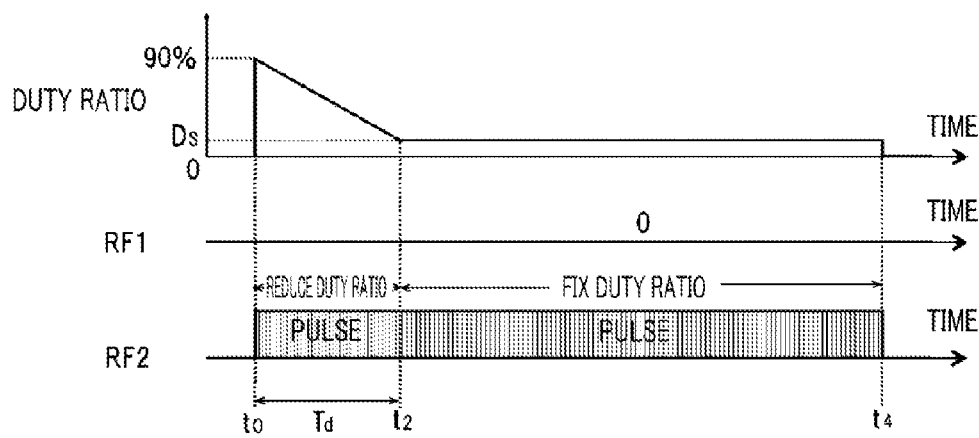
FIG. 7A is a diagram showing a first duty ratio control method in the seventh RF mode.

Here, in the first duty ratio control method [7RFM-1], as depicted in FIG. 7A, at a time point $T_0$ when starting the process, a duty ratio of the high frequency power RF2 to which the power modulation is performed is set to be an initial value (in this experimental example, about 90%) which allows plasma to be ignited securely under any power modulating conditions (particularly, a duty ratio and a pulse frequency). Then, immediately after the process is started, the duty ratio of the high frequency power RF2 is gradually reduced from the initial value (about 90%) in a regular negative gradient or in a ramp waveform. At a time point $t_2$ after a lapse of a preset time $T_d$, the duty ratio has the originally set value $D_s$ for the etching process. After the time point $t_2$, the duty ratio is fixed at the set value $D_s$ until the end (time point $T_4$) of the process. This first duty ratio control method [7RFM-1] may be appropriately used when plasma is difficult to be ignited in the seventh RF mode, for example, when the duty ratio $D_s$ is set to be low or a pulse frequency $f_s$ is set to be high.

Figure 7B:
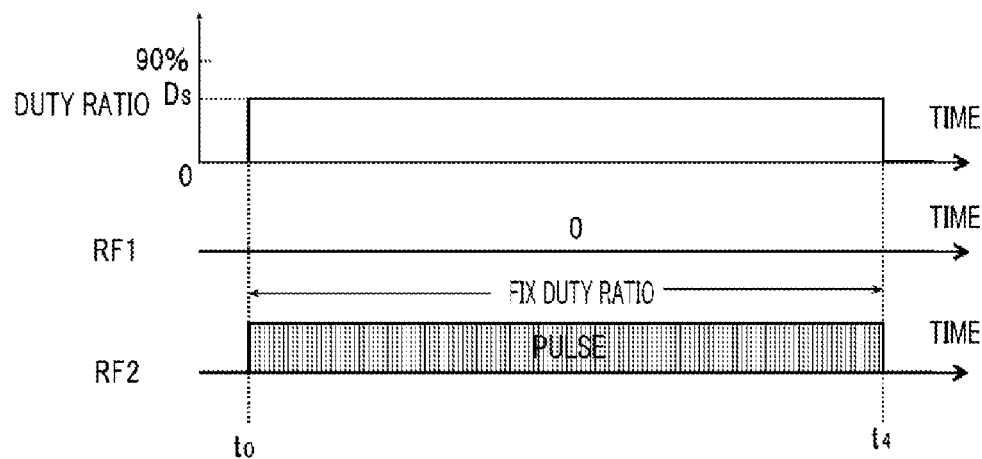
FIG. 7B is a diagram showing a second duty ratio control method in the seventh RF mode.

In the second duty ratio control method [7RFM-2] in the seventh RF mode, as depicted in FIG. 7B, a duty ratio of the high frequency power RF2 has the originally set value $D_s$ from the beginning ($t_0$) of the process to the end ($t_4$) of the process. This duty ratio control method [7RFM-2] may be appropriately used in case that it is possible to ignite plasma securely under the duty ratio $D_s$ and the pulse frequency $f_s$ of the power modulation performed in the etching process.

As described above, in the first example embodiment, when it is difficult to ignite plasma in the fourth RF mode, the fifth RF mode, and the seventh RF mode, the duty ratio of the power modulation is set to be the initial value (about 90%) for plasma ignition when starting the process, as illustrated in FIG. 4A, FIG. 5A and FIG. 7A. Then, during the transition time $T_d$, the duty ratio is gradually reduced from the initial value to the set value $D_s$ for the etching process in a ramp waveform. Here, if the transition time $T_d$ is too short, a matching operation within the matching device 40 (42) may become unstable, whereas if the transition time $T_d$ is too long, it may affect a process characteristic or a process result of the etching process. Typically, in consideration of such limits in the transition time $T_d$, the transition time $T_d$ may be set to be in the range from, e.g., about 0.5 sec to about 3.0 sec.

(Effect on Plasma Ignition Property in First Example Embodiment)

Now, according to the first example embodiment, a verification experiment for investigating an effect on plasma ignition of the first duty ratio control method [5RFM-1] in the fifth RF mode will be explained.

Figure 8:
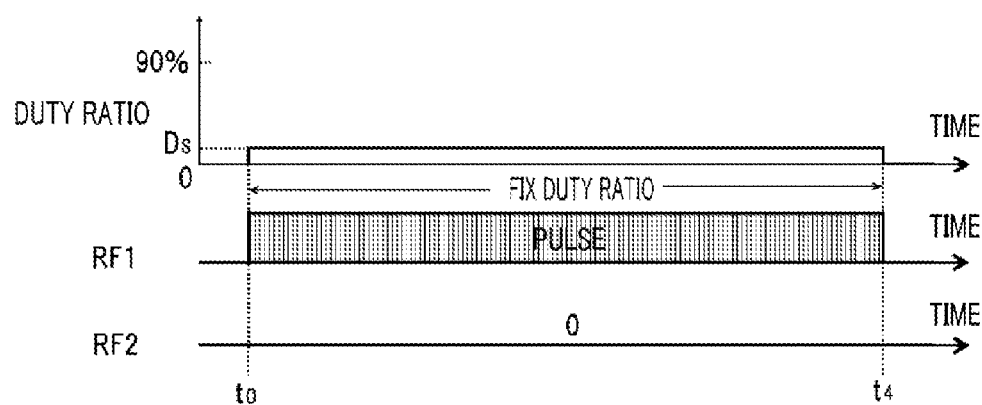
FIG. 8 is a diagram showing a sequence of using the second duty ratio control method in the fifth RF mode when a set value of a duty ratio is small.

The present inventors conduct a plasma etching experiment using the fifth RF mode. Major processing conditions are as follows: a chamber internal pressure is set to be, e.g., about 2666 Pa (about 20 mTorr); a RF1 power and a RF2 power are set to be, e.g., about 300 W and about 0 W, respectively; $C_4F_8/O_2/Ar$ (about 24 sccm/about 16 sccm/about 150 sccm) are used as an etching gas; and a gap between the electrodes is set to be, e.g., about 22 mm. In this experiment, the second duty ratio control method [5RFM-2] is used, and a duty ratio $D_s$ and a pulse frequency $f_s$ of the pulse modulation performed on a high frequency power RF1 are varied as parameters in the range from, e.g., about 10% to about 90% and in the range from, e.g., about 5 kHz to about 90 kHz, respectively. Then, plasma ignition properties in respective combinations of the parameter values ($f_s$, $D_s$) are evaluated. FIG. 8 illustrates a sequence when using the second duty ratio control method [5RFM-2] by selecting a low value (e.g., about 10%) as the set value of the duty ratio $D_s$.

FIG. 9A depicts an experimental result of using the second duty ratio control method [5RFM-2]. On a table (matrix) in this figure, cells in rows indicate parameter values of the set value of the duty ratio $D_s$, and cells in columns indicate parameter values of the pulse frequency $f_s$. A notation of "OK" implies that plasma is ignited and maintained stably in a process using parameter values ($f_s$, $D_s$) corresponding to a certain cell. Meanwhile, a notation of "NG" means that plasma is not ignited or is not stable though ignited in a process using parameter ($f_s$, $D_s$) corresponding to a certain cell. Further, a blank implies that an experiment for a process using parameter values ($f_s$, $D_s$) corresponding to a certain cell is not conducted.

As shown in this figure, experimental results of "NG" (meaning that plasma is not ignited or is not stable) are obtained when parameter values ($f_s$, $D_s$) are (about 40 kHz, about 40%), (about 40 kHz, about 50%), (about 40 kHz, about 60%), (about 40 kHz, about 70%), (about 40 kHz, about 80%), (about 50 kHz, about 70%), (about 50 kHz, about 80%), (about 60 kHz, about 60%), (about 60 kHz, about 70%), and (about 70 kHz, about 70%). In all of the other combinations of parameter values ($f_s$, $D_s$), experimental results of "OK" (meaning that plasma is ignited and is stable) are obtained.

For each of the parameter values ($f_s$, $D_s$) in the cases where the experimental results of "NG" are obtained under the second duty ratio control method [5RFM-2], the present inventors conduct a plasma etching experiment by using the first duty ratio control method [5RFM-1] under the same processing conditions as specified above. Then, plasma ignition property is evaluated.

As a result, as shown in FIG. 9B, experimental results of "OK" (meaning that plasma is ignited and is stable) are obtained in all of cases where the parameter values ($f_s$, $D_s$) are set to be (about 40 kHz, about 40%), (about 40 kHz, about 50%), (about 40 kHz, about 60%), (about 40 kHz, about 70%), (about 40 kHz, about 80%), (about 50 kHz, about 70%), (about 50 kHz, about 80%), (about 60 kHz, about 60%), (about 60 kHz, about 70%), and (about 70 kHz, about 70%).

Further, in this experiment, the transition time $T_d$ is set to be about 1.0 sec in all of the above cases. A notation of "1.0 s" in FIG. 9B indicates this setting of the transition time. Further, a notation of "OK" in FIG. 9B has the same meaning as in FIG. 9A. That is, the notation of "OK" implies that an experimental result of "OK" is obtained under the second duty ratio control method [5RFM-2] in a process using parameter values ($f_s$, $D_s$) corresponding to a certain cell.

Further, the present inventors also conduct another experiment for plasma etching using the fifth RF mode. In this another experiment, conditions of the chamber internal pressure, the RF1/RF2 powers and the etching gas are set to be the same as those of the aforementioned experiment, but a gap between the electrodes is changed to be, e.g., about 30 mm. As in the aforementioned experiment, the second duty ratio control method [5RFM-2] is used, and the duty ratio $D_s$ and the pulse frequency $f_s$ of the pulse modulation performed on the high frequency power RF1 are varied as parameters in the range from, e.g., about 10% to about 90% and in the range from, e.g., about 5 kHz to about 90 kHz, respectively. Then, the plasma ignition properties in respective combinations of the parameter values ($f_s$, $D_s$) are evaluated.

As a result, as depicted in FIG. 10A, when parameter values ($f_s$, $D_s$) are set to be (about 5 kHz, about 10%), (about 5 kHz, about 20%), (about 10 kHz, about 10%), (about 20 kHz, about 20%), (about 20 kHz, about 30%), (about 20 kHz, about 40%), (about 20 kHz, about 50%) and (about 30 kHz, about 30%), experimental results are "NG." In all of the other combinations of parameter values ($f_s$, $D_s$), "OK" are obtained.

Based on the experimental results, for each of the parameter values ($f_s$, $D_s$) when the experimental results of "NG" are obtained under the second duty ratio control method [5RFM-2], the present inventors conduct a plasma etching experiment by using the first duty ratio control method [5RFM-1] under the same processing conditions as specified above. Then, plasma ignition property is evaluated.

As a result, as shown in FIG. 10B, experimental results of "OK" (meaning that plasma is ignited and is stable) are obtained in all of cases when parameter values ($f_s$, $D_s$) are set to be (about 5 kHz, about 10%), (about 5 kHz, about 20%), (about 10 kHz, about 10%), (about 20 kHz, about 20%), (about 20 kHz, about 30%), (about 20 kHz, about 40%), (about 20 kHz, about 50%) and (about 30 kHz, about 30%).

Further, in this experiment, the transition time $T_d$ is set to be about 2.5 sec when the parameter values ($f_s$, $D_s$) are (about 5 kHz, about 10%) and (about 5 kHz, about 20%); about 1.5 sec, when the parameter values ($f_s$, $D_s$) are (about 10 kHz, about 10%); and about 1.0 sec, when the parameter values ($f_s$, $D_s$) are (about 20 kHz, about 20%), (about 20 kHz, about 30%), (about 20 kHz, about 40%), (about 20 kHz, about 50%) and (about 30 kHz, about 30%). Notations of "2.5 s," "1.5 s," and "1.0 s" in FIG. 10B indicate these setting of the transition time. Further, in FIG. 10B, a notation of "OK" implies that an experimental result of "OK" is obtained under the second duty ratio control method [5RFM-2] in a process using parameter values ($f_s$, $D_s$) corresponding to a certain cell.

As stated above, in the above-described fifth RF mode, when it is possible to ignite plasma securely under the second duty ratio control method [5RFM-2], it may be desirable to use the second duty ratio control method [5RFM-2] in which the duty ratio of the power modulation is fixed at the set value $D_s$ from the beginning of the process. However, when it is difficult to ignite plasma securely under the second duty ratio control method [5RFM-2], it may be desirable to use the first duty ratio control method [5RFM-1] in which the duty ratio of the power modulation is reduced in a ramp waveform immediately after the process is started, in order to perform a plasma process stably and securely under desired processing conditions.

Likewise, in the above-described fourth RF mode, when it is possible to ignite plasma securely under the second duty ratio control method [4RFM-2], it may be desirable to use the second duty ratio control method [4RFM-2] in which the duty ratio of the power modulation is fixed at the set value $D_s$ from the beginning of the process. However, when it is difficult to ignite plasma securely under the second duty ratio control method [4RFM-2], it may be desirable to use the first duty ratio control method [4RFM-1] in which the duty ratio of the power modulation is reduced in a ramp waveform immediately after starting the process in order to perform a plasma process stably and securely under desired processing conditions.

Furthermore, in the above-described seventh RF mode as well, when it is possible to ignite plasma securely under the second duty ratio control method [7RFM-2], it may be desirable to use the second duty ratio control method [7RFM-2] in which the duty ratio of the power modulation is fixed at the set value $D_s$ from the beginning of the process. However, when it is difficult to ignite plasma securely under the second duty ratio control method [7RFM-2], it may be desirable to use the first duty ratio control method [7RFM-1] in which the duty ratio of the power modulation is reduced in a ramp waveform immediately after starting the process in order to perform a plasma process stably and securely under desired processing conditions.

(Configuration and Operation of High Frequency Power Feed Unit in First Example Embodiment)

Figure 11:
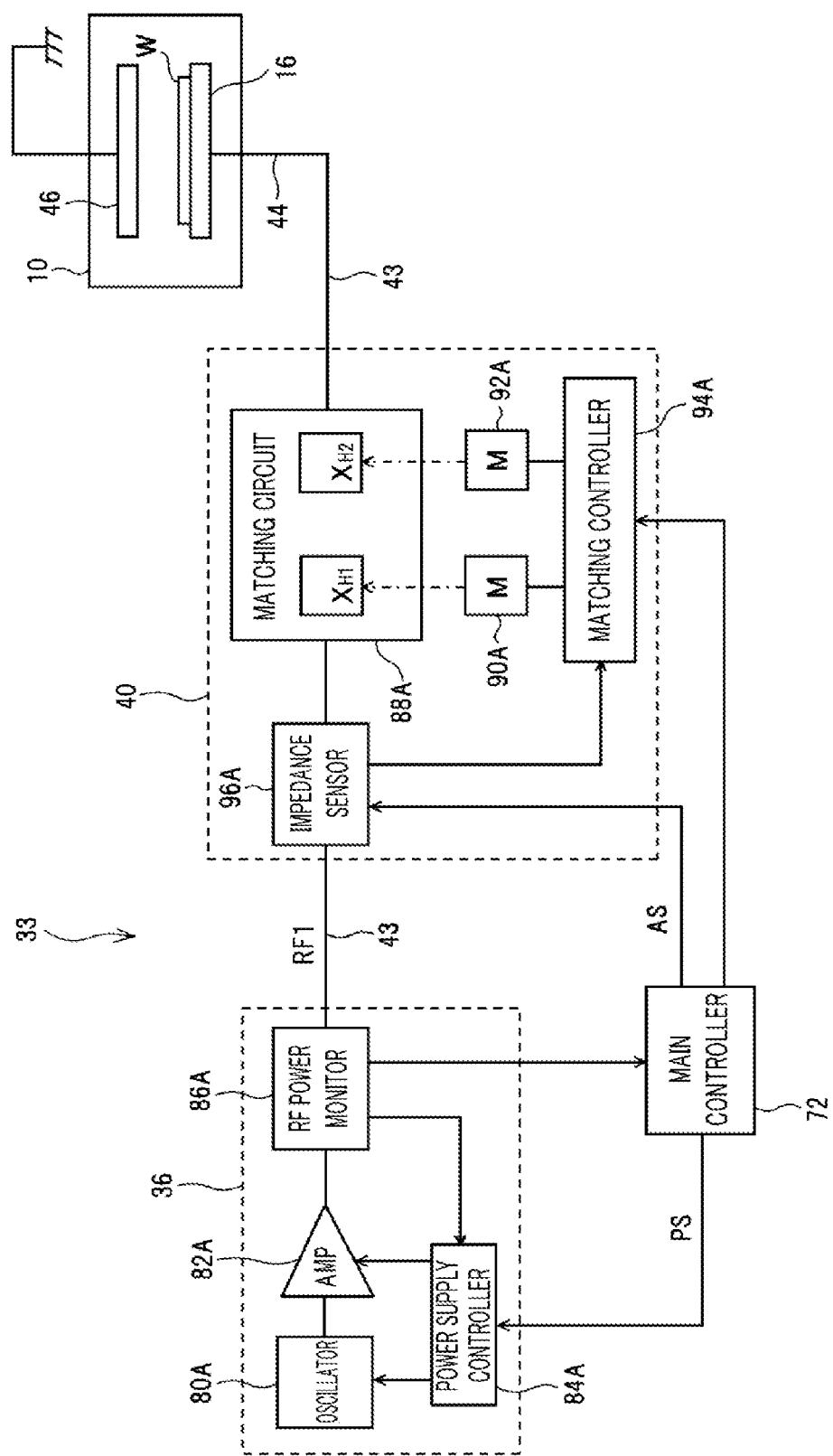
FIG. 11 is a block diagram illustrating a configuration of a high frequency power feed unit in a high frequency power system suitable for plasma generation in the example embodiment.

FIG. 11 illustrates a configuration of the high frequency power feed unit 33, particularly, the high frequency power supply 36 and the matching device 40 in accordance with the first example embodiment.

The high frequency power supply 36 includes an oscillator 80A configured to generate a sine wave of a frequency (e.g., about 100 MHz) suitable for plasma generation; a power amplifier 82A configured to amplify a power of the sine wave outputted from the 80A with a variable gain or amplification factor; and a power supply controller 84A configured to control the oscillator 80A and the power amplifier 82A directly in response to a control signal from the main controller 72. Not only the pulse signal PS for the modulation control but typical control signals for power on/off or power interlock relationship and data such as power setting values are also inputted from the main controller 72 to the power supply controller 84A. The main controller 72 and the power supply controller 84A constitute a power modulation unit of a high frequency power RF1 system.

Within the high frequency power supply 36, a RF power monitor 86A is also included. The RF power monitor 86A may include, though not illustrated, a directional coupler, a progressive wave power monitor and a reflection wave power monitor. Here, the directional coupler extracts signals corresponding to a RF power (progressive wave) propagating on the high frequency transmission line 43 in a forward direction and a RF power (reflection wave) propagating on the high frequency transmission line 43 in a backward direction. The progressive power monitor is configured to output a signal indicating a power of a fundamental frequency progressive wave (about 100 MHz) included in the progressive wave propagating on the high frequency transmission line 43 based on the progressive wave power detection signal extracted by the directional coupler. This signal, i.e., a fundamental frequency progressive wave power measurement value is sent to the power supply controller 84A within the high frequency power supply 36 for power feedback control and also sent to the main controller 72 for monitor display. The reflection wave power monitor is configured to measure a power of a fundamental frequency reflection wave (about 100 MHz) included in the reflection wave returning back to the high frequency power supply 36 from plasma within the chamber 10 and, also, to measure a total power of all reflection wave spectra included in the reflection wave returned back to the high frequency power supply 36 from the plasma within the chamber 10. A fundamental frequency reflection wave power measurement value outputted by the reflection wave power monitor is sent to the main controller 72 for monitor display, and a total reflection wave power measurement value is sent to the power supply controller 84A within the high frequency power supply 36 as a monitoring value for protecting the power amplifier.

The matching device 40 includes a matching circuit 88A having a multiple number of, e.g., two variable reactance elements (e.g., variable capacitors or variable reactors) $X_{H1}$ and $X_{H2}$; a matching controller 94A configured to vary reactance of the variable reactance elements $X_{H1}$ and $X_{H2}$ via actuators such as stepping motors (M) 90A and 92A; and an impedance sensor 96A configured to measure load impedance including impedance of the matching circuit 88A on the high frequency transmission line 43.

The matching controller 94A is operated under the control of the main controller 72. The matching controller 94A is configured to vary the reactance of the variable reactance elements $X_{H1}$ and $X_{H2}$ by controlling the motors 90A and 92A such that a measurement value of the load impedance measured by the impedance sensor 96A may be equal to or approximate to a matching point (typically, about 50Ω) corresponding to the impedance on the side of the high frequency power supply 36.

The impedance sensor 96A includes, though not shown, a RF voltage detector and a RF current detector; and a load impedance measurement value calculating unit. The RF voltage detector and the RF current detector are configured to detect a RF voltage and a RF current on the high frequency transmission line 43, respectively. Further, the load impedance measurement value calculating unit is configured to calculate a measurement value of the load impedance from the RF voltage value and the RF current value detected by the RF voltage detector and the RF current detector, respectively.

Figure 13:
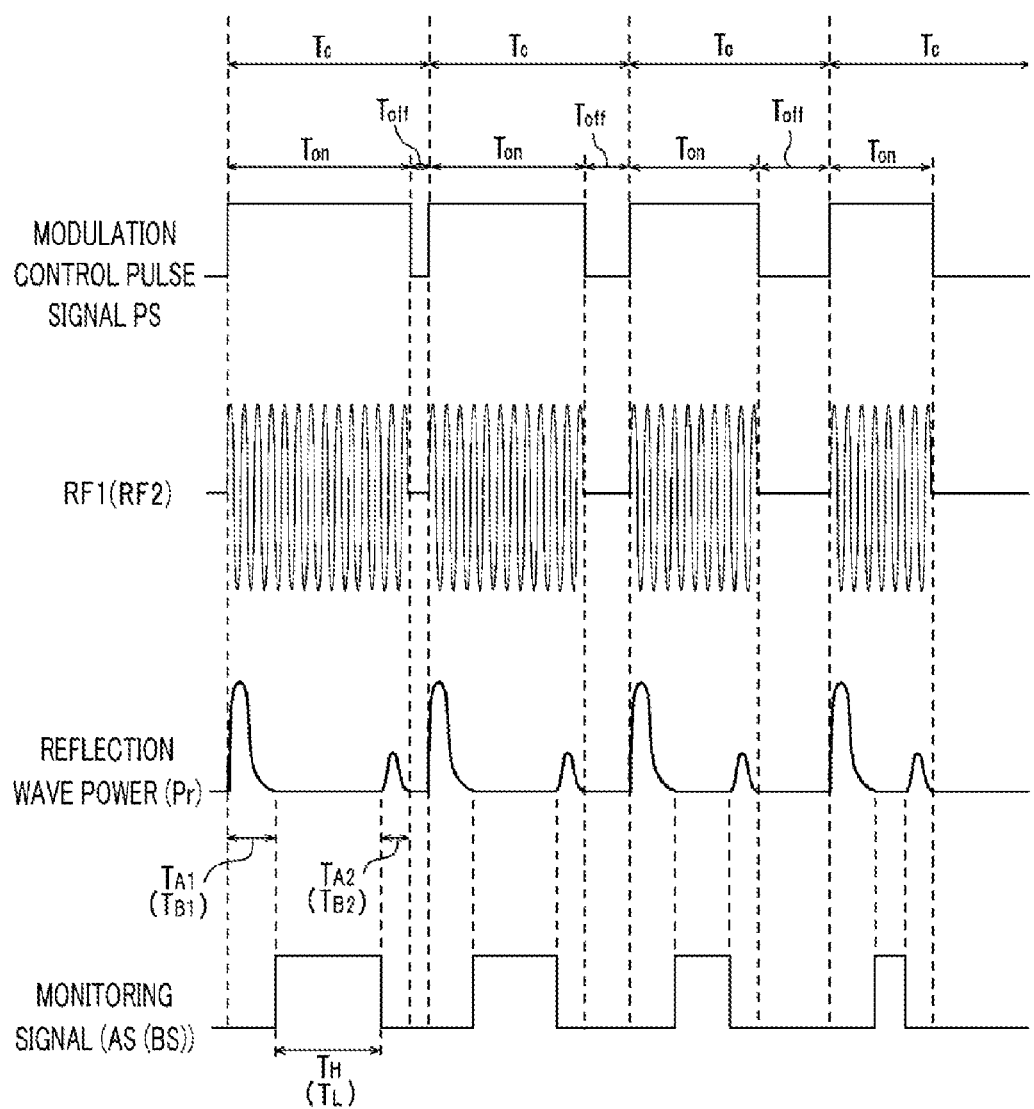
FIG. 13 is a diagram showing waveforms of components for describing an operation of a matching device in the example embodiment.

In this first example embodiment, as shown in FIG. 13, when performing the power modulation on the high frequency power RF1, a monitoring signal AS designating a monitoring time (load impedance measuring time) $T_H$ included in an on-period $T_{on}$ for each cycle of the pulse frequency is sent from the main controller 72 to the impedance sensor 96A. Desirably, as depicted in FIG. 13, the monitoring time $T_H$ is set within a time range excluding transition times $T_{A1}$ and $T_{A2}$ immediately after and immediately before the on-period $T_{on}$. Here, during the transition times $T_{A1}$ and $T_{A2}$, a RF1-based reflection wave power increases abruptly on the high frequency transmission line 43. Further, the monitoring time $T_H$ is set within the on-period $T_{on}$, not within an off-period $T_{off}$ even if the high frequency power RF1 is on/off by the pulse frequency $f_s$. Thus, from the matching device 40, the high frequency power RF1 seems to be a continuous wave CW which is kept on.

The impedance sensor 96A measures the load impedance during the monitoring time $T_H$ which is controlled by the monitoring signal AS. Accordingly, the measurement value of the load impedance sent to the matching controller 94A from the impedance sensor 96A is updated for each cycle of the pulse frequency $f_s$ in synchronization with the power modulation. Even during this updating operation, the matching controller 94A does not stop the matching operation, i.e., the control of varying the reactance of the reactance elements $X_{H1}$ and $X_{H2}$, and drives the stepping motors 90A and 92A continuously such that load impedance measurement value immediately before updating operation can be equal to or approximate to the matching point.

In this example embodiment, the main controller 72 serves as a monitoring time controller for the matching device 40 and controls the monitoring time $T_H$ in proportion to a variation in the duty ratio in the power modulation of the high frequency power RF1. That is, as depicted in FIG. 13, when the duty ratio of the power modulation is reduced gradually immediately after the process is started, the monitoring time $T_H$ is also gradually reduced in proportion.

Figure 12:
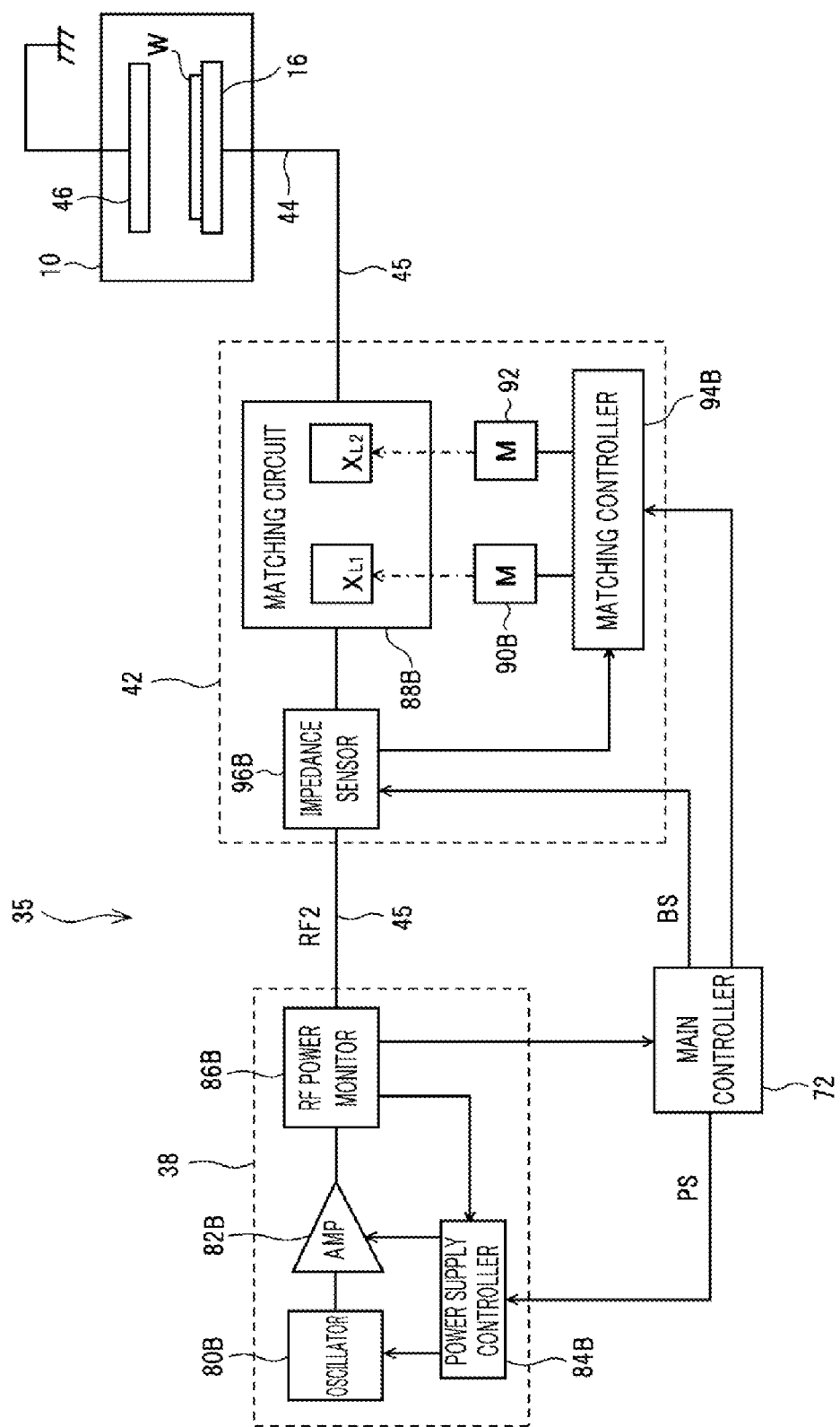
FIG. 12 is a block diagram illustrating a configuration of a high frequency power feed unit for a high frequency power system suitable for ion attraction in the example embodiment.

FIG. 12 illustrates a configuration of the high frequency power feed unit 35 in accordance with the first example embodiment. The high frequency power supply 38 and the matching device 42 of the high frequency power feed unit 35 have the same configurations and functions as those of the high frequency power supply 36 and the matching device 40 of the above-described high frequency power feed unit 33 except that a frequency (e.g., about 13.56 MHz) of the high frequency power RF2 used in the high frequency power feed unit 35 is different from the frequency (e.g., about 100 MHz) of the high frequency power RF1. That is, except that an oscillator 80B of the high frequency power supply 38 generates a sine wave having a frequency (e.g., about 13.56 MHz) suitable for ion attraction, respective components within the high frequency power supply 38 and the matching device 42 have the same configurations and functions as those of corresponding components within the high frequency power supply 36 and the matching device 40. By way of example, a power supply controller 84B and the main controller 72 constitute a power modulation unit of the high frequency power RF2 system.

Here, a modulation control pulse signal PS and a monitoring signal BS are respectively sent from the main controller 72 to the power supply controller 84B within the high frequency power supply 38 and an impedance sensor 96B within the matching device 42 of the high frequency power supply 38, independently from the signals for the high frequency power feed unit 33.

That is, when performing the power modulation on the high frequency power RF2, as depicted in FIG. 13, a monitoring signal BS designating a monitoring time (load impedance measuring time) $T_L$ included in an on-period $T_{on}$ for each cycle of the pulse frequency is sent from the main controller 72 to the impedance sensor 96B. Desirably, as depicted in FIG. 13, the monitoring time $T_L$ is set within a time range excluding transition times $T_{B1}$ and $T_{B2}$ immediately after and immediately before the on-period $T_{on}$. Here, during the transition times $T_{B1}$ and $T_{B2}$ a RF2-based reflection wave power increases abruptly on the high frequency transmission line 45. Further, the monitoring time $T_L$ is set within the on-period $T_{on}$, not within an off-period $T_{off}$ even if the high frequency power RF2 is on/off by the pulse frequency $f_s$. Thus, from the matching device 42, the high frequency power RF2 seems to be a continuous wave CW which is kept on.

The impedance sensor 96B measures the load impedance during the monitoring time $T_L$ which is controlled by the monitoring signal BS. Accordingly, a measurement value of the load impedance sent to the matching controller 94B from the impedance sensor 96B is updated for each cycle of the pulse frequency $f_s$ in synchronization with the power modulation. Even during this updating operation, the matching controller 94B does not stop a matching operation, i.e., a control of varying reactance of reactance elements $X_{L1}$ and $X_{L2}$ and drives stepping motors 90B and 92B continuously such that a load impedance measurement value immediately before updating operation can be equal to or approximate to the matching point.

The main controller 72 serves as a monitoring time controller for the matching device 42 and controls the monitoring time $T_L$ in proportion to a duty ratio in the power modulation of the high frequency power RF2. That is, as depicted in FIG. 13, when the duty ratio of the power modulation is reduced gradually immediately after the process is started, the monitoring time $T_L$ is also gradually reduced in proportion.

Regarding the matching operation, the present inventors investigate effects on the first duty ratio control method [5RFM-1] (FIG. 5A) in the fifth RF mode and the monitoring time control method (FIG. 13) through the plasma etching experiment conducted under the same processing conditions as specified above. In this experiment, variable capacitors $RF_1C_1$ and $RF_1C_2$ are used as the two variable reactance elements $X_{H1}$ and $X_{H2}$ included in the matching circuit 88A of the matching device 40, respectively.

Figure 14:
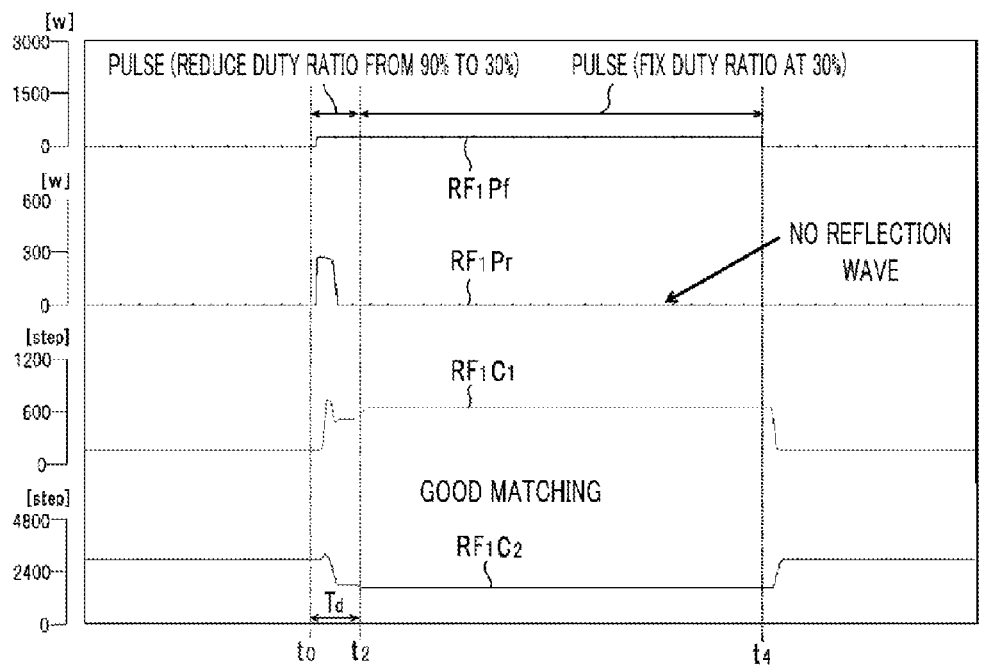
FIG. 14 is a diagram showing waveforms of components observed in an experimental example.

FIG. 14 shows waveforms of the respective components observed in the experiment of this experimental example. As shown in the figure, a step (capacitance position) of the variable capacitor $RF_1C_1$ is overshot from an initial value immediately after a process is started. Then, the step (capacitance position) stabilized during a transition time $T_d$ (e.g., about 2.5 sec) in the $RF_1C_1$ is maintained substantially constant afterwards even after a duty ratio is fixed at a set value $D_s$ (e.g., about 30%). Further, a step (capacitance position) of the variable capacitor $RF_1C_2$ decreases from an initial value in a step shape immediately after the process is started. Then, the step (capacitance position) of the $RF_1C_2$ stabilized during the transition time $T_d$ is maintained substantially constant afterwards even after a duty ratio is fixed at the set value $D_s$ (e.g., about 30%). A reflection wave power $RF_1P_r$ on the high frequency transmission line 43 is impulsively generated immediately after the process is started, but it stops during the transition time $T_d$ and almost no reflection wave power is generated thereafter. As stated, in this experimental example, it is observed that impedance matching is achieved on the high frequency transmission line 43 from the mid of the transition time $T_d$ until the end of the process.

Figure 15:
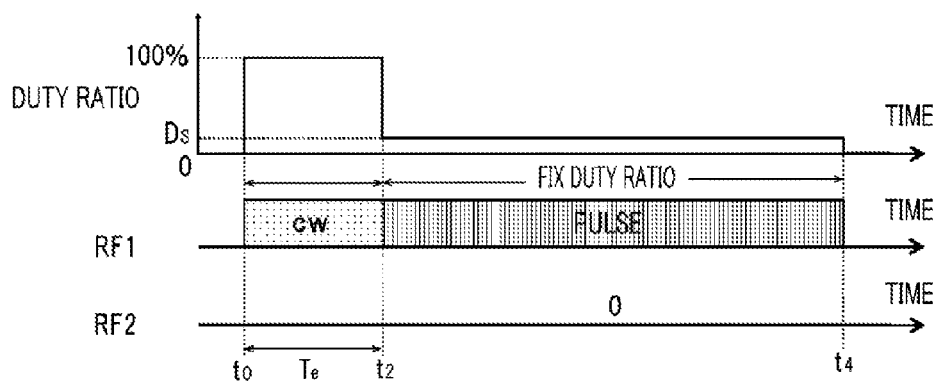
FIG. 15 is a diagram showing a duty ratio control method of a comparative example.

As a comparative example, as shown in FIG. 15, the present inventors also conduct a plasma etching experiment under the same processing conditions as those of the above-described experimental example by using a duty ratio control method in which a high frequency power RF1 is set as a continuous wave (duty ratio of about 100%) during a starting time $T_e$ (e.g., about 2.5 sec) corresponding to the transition time $T_d$ of the experimental example immediately after the process is started, and the power modulation of the set duty ratio $D_s$ (e.g., about 30%) is performed on the high frequency power RF1 after the lapse of the starting time $T_e$.

Figure 16:
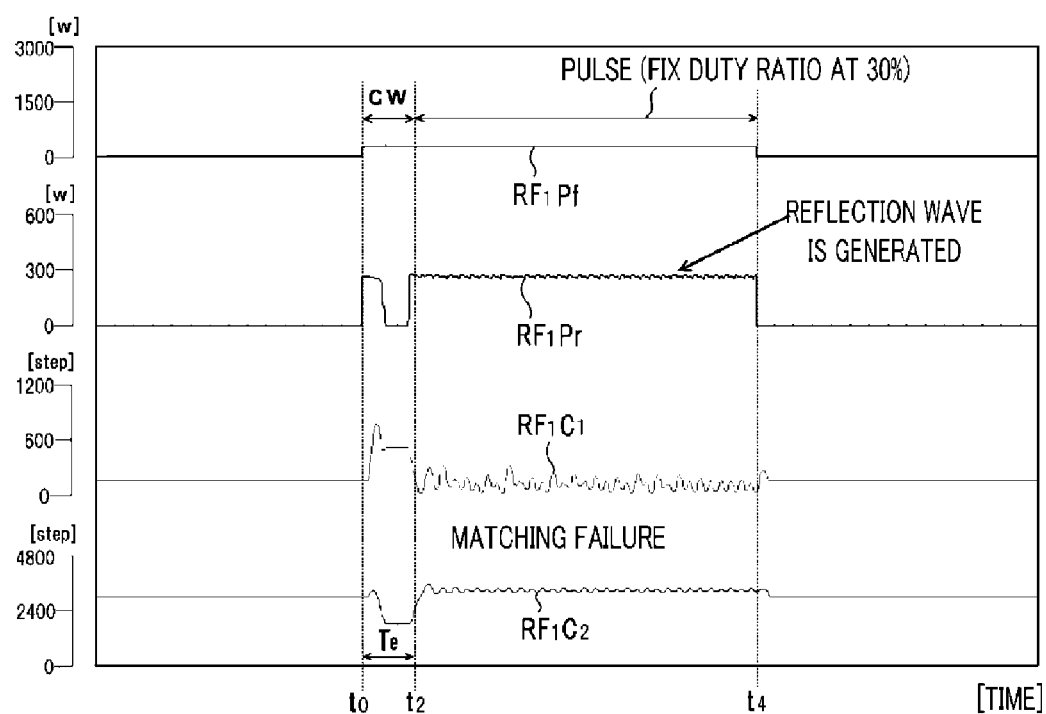
FIG. 16 is a diagram showing waveforms of components observed in the comparative example.

FIG. 16 shows waveforms of the respective components observed in this comparative example. As shown in the figure, the waveforms of the respective components during the starting time $T_e$ are mostly the same as those of the experimental example. Further, in this comparative example, the monitoring signal AS (designating the monitoring time $T_H$ within the on-period $T_{on}$ for each cycle of the pulse frequency), which is the same as that in the experimental example, is sent from the main controller 72 to the impedance sensor 96A of the matching device 40. However, waveforms of the respective components after the starting time $T_e$, i.e., after the high frequency power RF1 is switched to a pulse of the power modulation from the continuous wave CW (after a time point $t_2$) are totally different from those of the experimental example, except for a progressive wave power $RF_1P_f$ on the high frequency transmission line 43.

That is, the step (capacitance position) of the variable capacitor $RF_1C_1$ is returned to an initial value immediately after the high frequency power RF1 is switched to the pulse of the power modulation (i.e., immediately after the time point $t_2$), and great hunting occurs continuously until the end of the process. Further, the step (capacitance position) of the variable capacitor $RF_1C_2$ is also returned to an initial value immediately after the high frequency power RF1 is switched to the pulse of the power modulation (i.e., immediately after the time point $t_2$), and hunting occurs continuously until the end of the process, though the degree of the hunting is not as great as that of the variable capacitor $RF_1C_1$. Meanwhile, the reflection wave power $RF_1P_r$ on the high frequency transmission line 43 is found to be increased greatly in a step shape immediately after the high frequency power RF1 is switched to the pulse of the power modulation (i.e., immediately after the time point $t_2$) and does not decrease until the end of the process. As stated above, in the comparative example, even though a matching monitoring method of limiting a monitoring time of the impedance sensor to within an on-period of each cycle of the pulse frequency, it is found out that impedance matching is not achieved at all on the high frequency transmission line 43 until the end of the process after the high frequency power RF1 is switched to the pulse of the power modulation from the continuous wave CW.

Further, in the comparative example, such a failure in the matching operation (FIG. 16) may occur when the plasma load impedance is greatly different between the two cases when the first high frequency power is the continuous wave CW and the first high frequency power is under the power modulation. Mostly, the failure in the matching operation may be highly likely to occur when the duty ratio of the power modulation is low. However, even if the duty ratio is low, if a difference (variation) in the plasma load impedance is small due to other conditions such as a pressure, such a failure in the matching operation may be avoided. In any cases, it may be possible to solve the problem of matching failure in, e.g., the comparative example, by using the duty ratio control method in accordance with the example embodiment.

(Configuration and Operation of Plasma Processing Apparatus in Second Example Embodiment)

Figure 17:
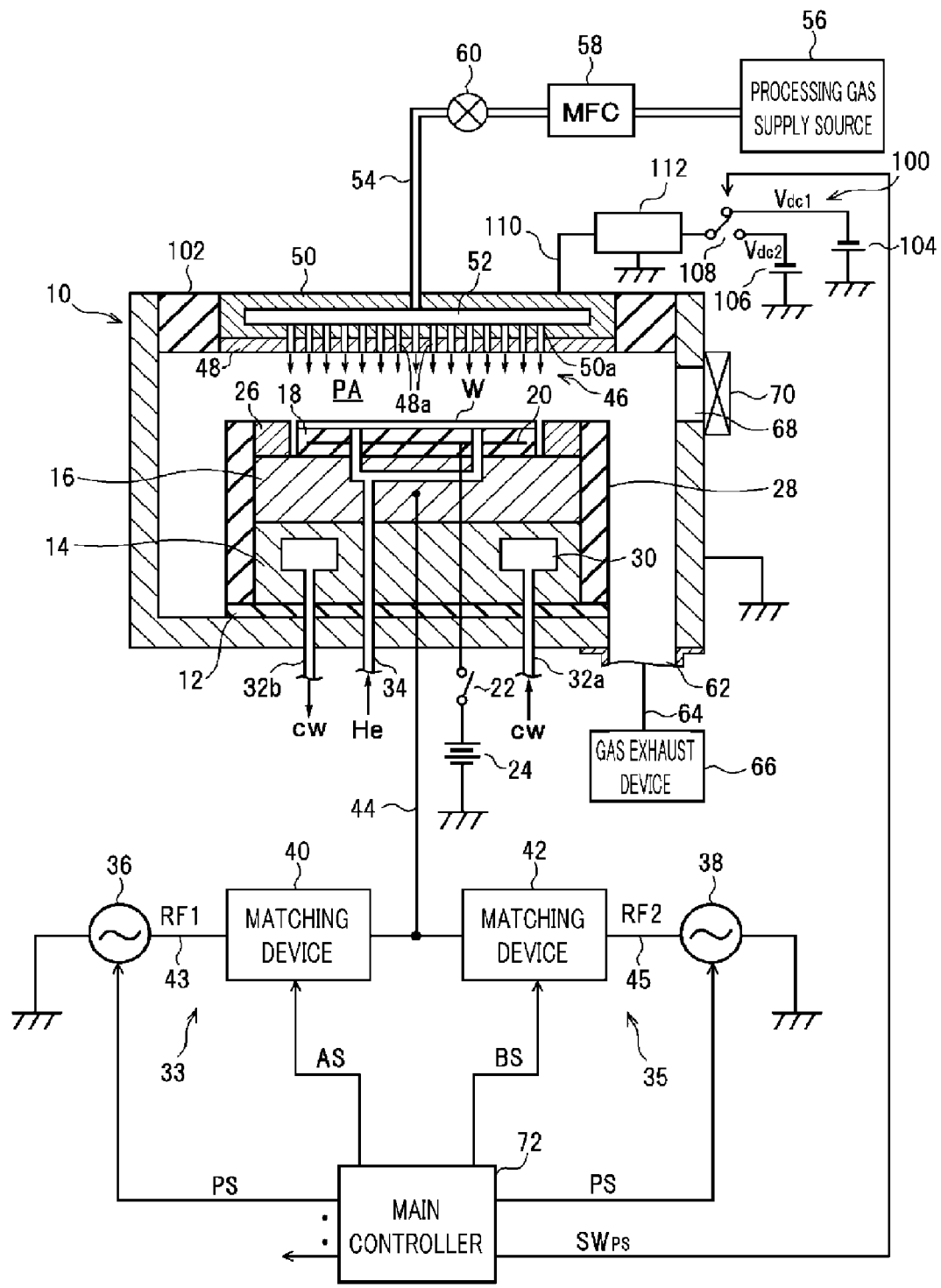
FIG. 17 is a diagram illustrating a configuration of a plasma processing apparatus in accordance with a second example embodiment.

FIG. 17 illustrates a configuration of a plasma processing apparatus in accordance with a second example embodiment. In this figure, parts having the same configurations as or similar functions to those of the plasma processing apparatus (FIG. 1) of the first example embodiment will be assigned the same reference numerals as those in the first example embodiment.

In the second example embodiment, a DC power supply unit 100 configured to apply a negative DC voltage $V_{dc}$ to the upper electrode 46 is provided. In this configuration, the upper electrode 46 is provided at an upper portion of the chamber 10 via a ring-shaped insulator 102. The ring-shaped insulator 102 is made of, but not limited to, alumina ($Al_2O_3$). The ring-shaped insulator 102 hermetically seals a minute gap between a peripheral surface of the upper electrode 46 and a sidewall of the chamber 10, and physically supports the upper electrode 46 at non-ground potential.

In the second example embodiment, the DC power supply unit 100 includes two DC power supplies 104 and 105 having different output voltages (absolute values thereof); and a switch 108 configured to selectively connect the DC power supplies 104 and 106 to the upper electrode 46. The DC power supply 104 is configured to output a negative DC voltage $V_{dc1}$ (e.g., about −2000 V to about −1000 V) having a relatively larger absolute value, whereas the DC power supply 106 is configured to output a negative DC voltage $V_{dc2}$ (e.g., about −300 V to about 0 V) having a relatively smaller absolute value. The switch 108 is operated in response to a switching control signal $SW_{ps}$ from the main controller 72. The switch 108 is configured to be switched between a first switch position where the DC power supply 104 is connected to the upper electrode 46 and a second switch position where the DC power supply 106 is connected to the upper electrode 46. Further, the switch 108 also has a third switch position where the upper electrode 46 is suppressed from being connected to any of the DC power supplies 104 and 106.

A filter circuit 112 is provided on a DC power feed line 110 to be located between the switch 108 and the upper electrode 46. The filter unit 112 is configured to allow the DC voltage $V_{dc1}$ ($V_{dc2}$) from the DC power supply unit 100 to be applied to the upper electrode 46 therethrough and, also, allows a high frequency power introduced into the DC power feed line 110 from the susceptor 16 through the processing space PA and the upper electrode 46 to flow through a ground line without flowing into the DC power supply unit 100.

Furthermore, DC ground parts (not shown) made of a conductive material such as Si or SiC are provided at appropriate positions facing the processing space PA within the chamber 10. The DC ground parts are continuously grounded via a ground line (not shown).

Figure 18:
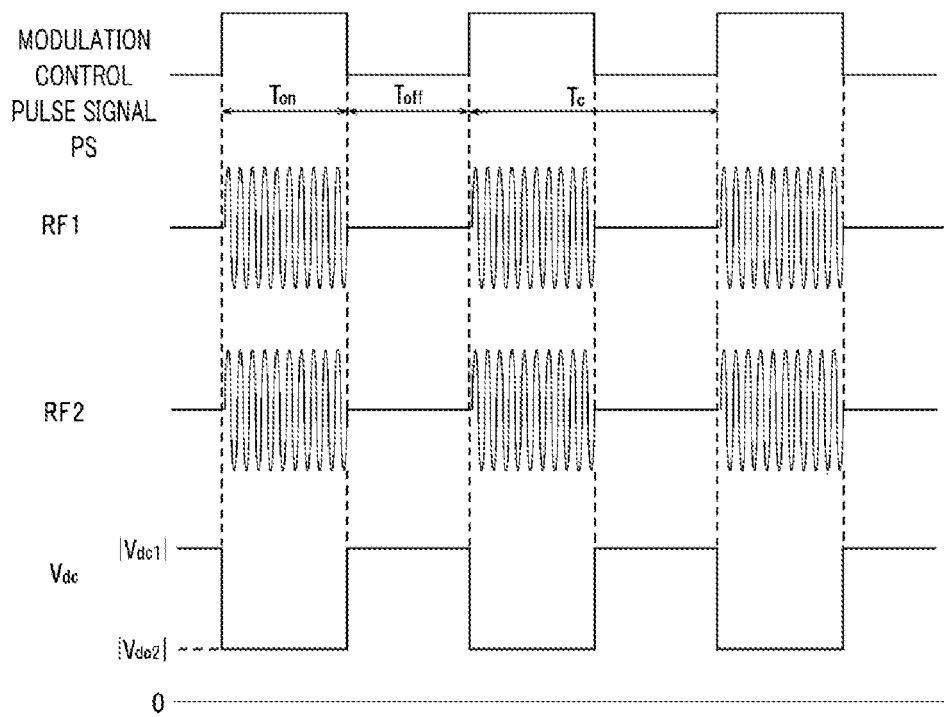
FIG. 18 is a diagram showing an eighth RF mode in the plasma processing apparatus.

In the capacitively coupled plasma etching apparatus having the above-described configuration, as for the kinds, forms, and combinations of high frequency powers applied to the susceptor (lower electrode) 16 within the chamber 10, the aforementioned first RF mode to the seven RF mode (see FIG. 2A to FIG. 3D) may be selectively used under the control of the main controller 72 upon high frequency power feed units 33 and 35 as the same as in the first example embodiment. Further, under the control of the main controller 72 upon the high frequency power feed units 33 and 35 and the DC power supply unit 100, it may be also possible to select an eighth RF mode or a (RF+DC) mode, as shown in FIG. 18. By way of example, the eighth RF mode may be selected when modifying an organic mask such as an ArF photoresist having low etching resistance by injecting secondary ions generated in the upper electrode 46 into the surface layer of the semiconductor wafer W at a high speed.

In the eighth RF mode, the high frequency powers RF1 and RF2 of the high frequency power feed units 33 and 35 are set to have the same pulse waveform with the same phase and the same duty ratio through the power modulation. Further, by switching the switch 108, an output of the DC power supply unit 100 is synchronized with the power modulation. The DC voltage $V_{dc1}$ having a large absolute value is applied to the upper electrode 46 during an off-period $T_{off}$, whereas the DC voltage $V_{dc2}$ having a small absolute value is applied to the upper electrode 46 during an on-period $T_{on}$. A switching control signal $SW_{ps}$ which is in synchronization with the modulation control pulse signal PS is sent to the switch 108 from the main controller 72. A ratio ($V_{dc2}/(V_{dc1}+V_{dc2})$) of time period during which the DC voltage $V_{dc2}$ is applied within a single cycle of a pulse frequency depends on the duty ratio of the high frequency powers RF1 and RF2.

Figure 19:
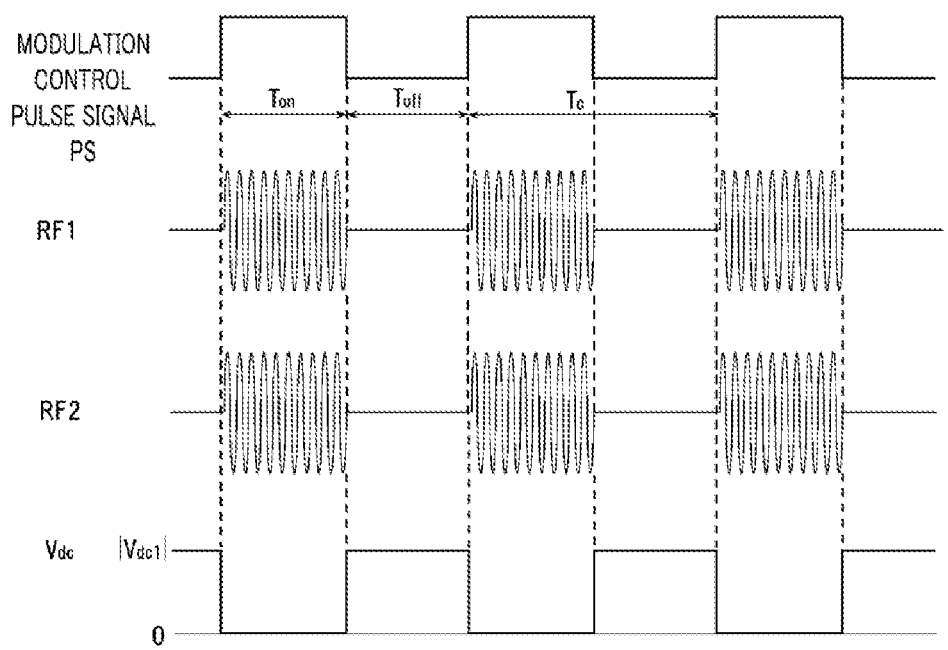
FIG. 19 is a diagram showing a modification example of the eighth RF mode.

Further, as one modification example of the eighth RF mode, the DC power supply 106 may be omitted (or maintained off constantly), for example, and it may be possible to turn on and off an output of the DC power supply 104 (i.e., to apply the DC voltage $V_{dc1}$ only during the off-period $T_{off}$) in synchronization with the power modulation, as depicted in FIG. 19. Further, it may be also possible to use variable DC power supplies as the DC power supplies 104 and 106.

Figure 20A:
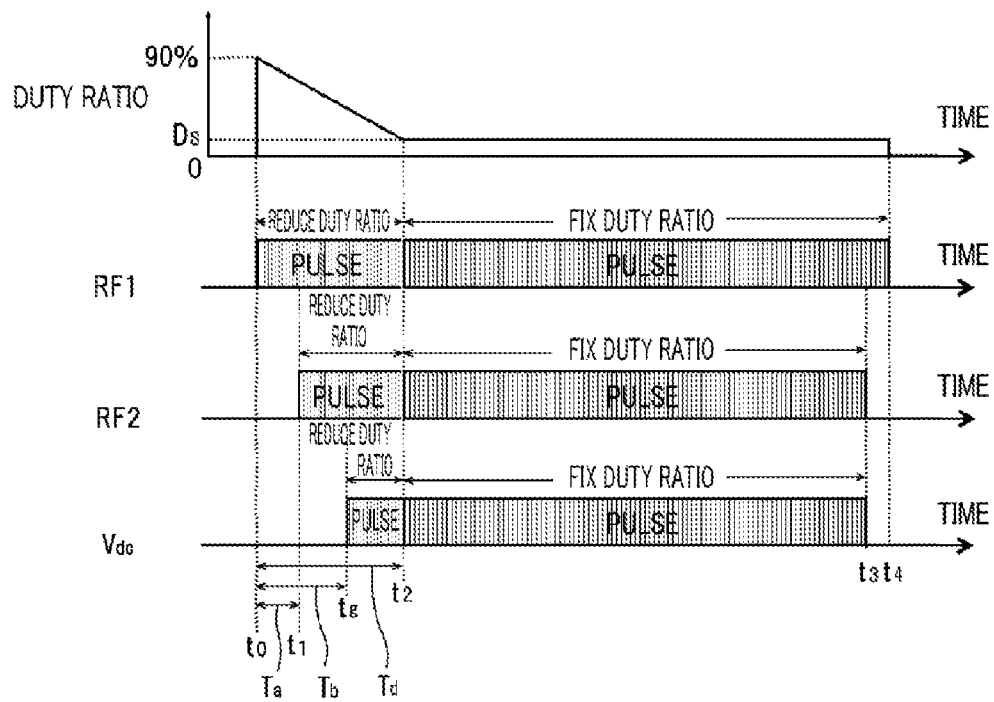
FIG. 20A is a diagram showing a first duty ratio control method in the eighth RF mode.
Figure 20B:
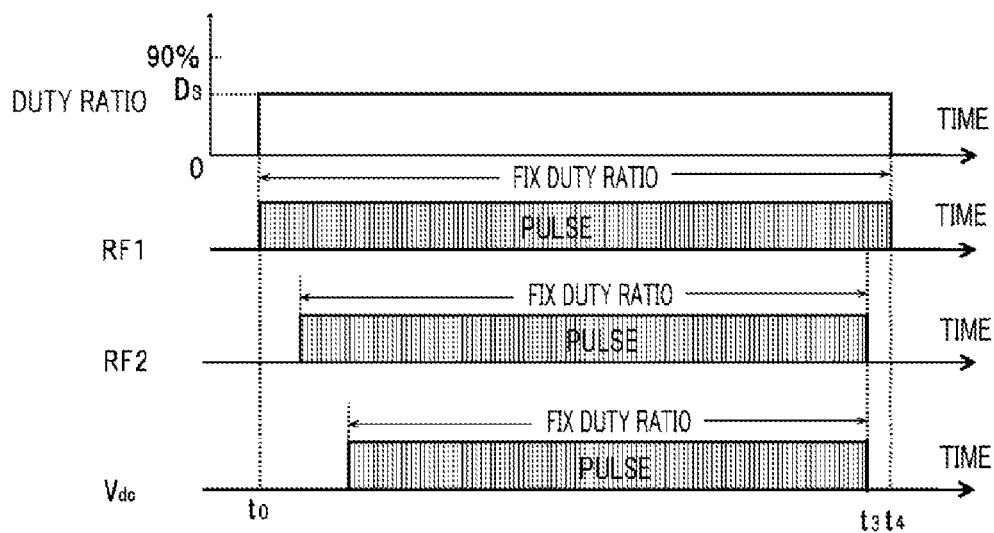
FIG. 20B is a diagram showing a second duty ratio control method in the eighth RF mode.

In the eighth RF mode, two kinds of duty ratio control methods [8RFM-1, 8RFM-2] may be selectively used. In the eighth RF mode, as depicted in FIG. 20A and FIG. 20B, when starting a process, the high frequency power RF1 (high frequency power feed unit 33) for plasma generation is first driven at a time point $t_0$. Then, at a time point $T_1$ after a lapse of a certain time $T_a$, the high frequency power RF2 (high frequency power feed unit 35) for ion attraction is driven. Thereafter, at a time point $t_g$ after a lapse of a certain time $T_b$ ($T_b$>$T_a$), the DC voltage $V_{dc}$ (DC power supply unit 100) is driven.

Here, in the first duty ratio control method [8RFM-1], as shown in FIG. 20A, at the time point $T_o$ when starting the process, the duty ratio of the high frequency powers RF1 and RF2 and the DC voltage $V_{dc}$ is set to be an initial value (e.g., about 90%) which allows plasma to be ignited securely under any power modulating conditions (particularly, a duty ratio and a pulse frequency).

At the substantially same time of starting the process, the duty ratio of the RF1 and the RF2 and the $V_{dc}$ is gradually reduced from the initial value (about 90%) in a regular negative gradient or in a ramp waveform. At a time point $t_2$ after a lapse of a preset time $T_d$ ($T_d$>$T_b$), the duty ratio has the originally set value $D_s$ for the etching process. After the time point $t_2$, the duty ratio is fixed or maintained at the set value $D_s$ until the end (time point $T_4$) of the process. This first duty ratio control method [8RFM-1] may be effective when plasma is difficult to be ignited in the eighth RF mode, e.g., when the duty ratio $D_s$ is set to be low or a pulse frequency $f_s$ is set to be high.

In the second duty ratio control method [8RFM-2], as shown in FIG. 20B, the duty ratio of the RF1 and the RF2 and the $V_{dc}$ has the originally set value $D_s$ from the beginning ($t_0$) of the process to the end ($t_3$, $t_4$) of the process. This duty ratio control method [8RFM-2] may be appropriately used when it is possible to ignite plasma securely under the duty ratio $D_s$ and the pulse frequency $f_s$ of the power modulation performed in the etching process.

Further, in the plasma etching apparatus (FIG. 17) of the second example embodiment, it may be also possible to turn off the DC power supply unit 100 and electrically separate it from the upper electrode 46. In such a case, it may be possible to use the aforementioned first RF mode to the seventh RF mode selectively, as in the plasma etching apparatus (FIG. 1), and the above-described duty ratio control method may be used in the fourth RF mode to the seventh RF mode.

Other example embodiments or modification examples

Figure 21A:
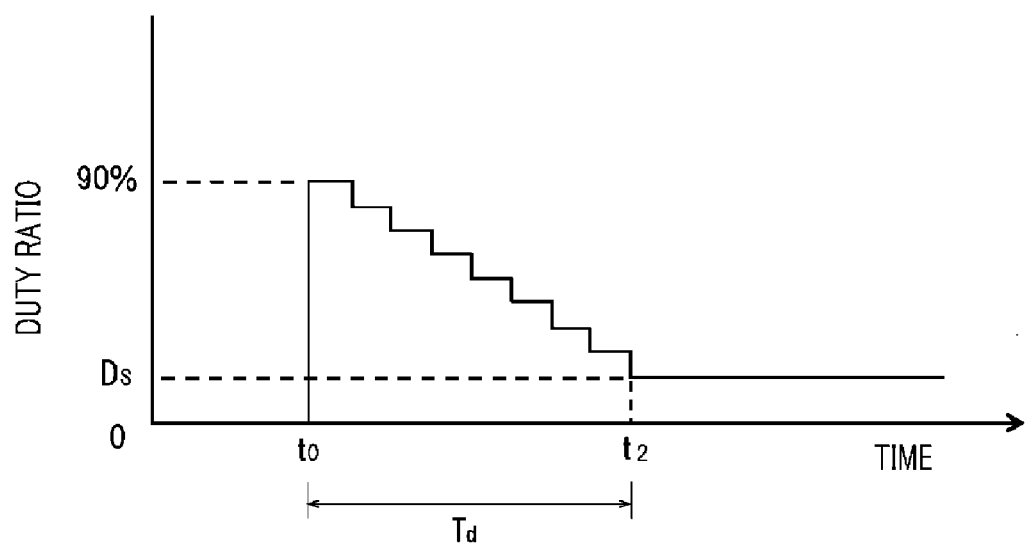
FIG. 21A is a diagram showing a duty ratio control method in accordance with a modification example.
Figure 21B:
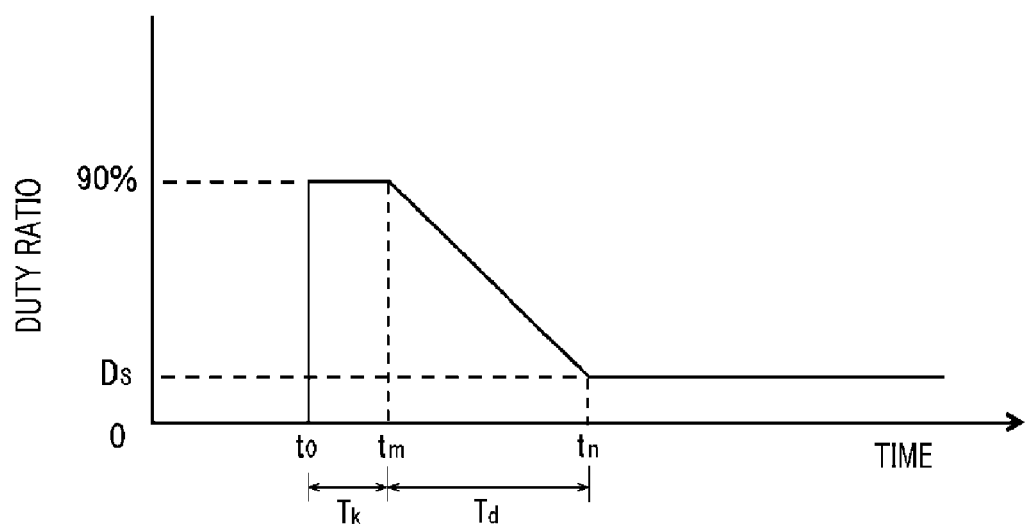
FIG. 21B is a diagram showing a duty ratio control method in accordance with another modification example.

From the foregoing, it will be appreciated that various embodiments of the present disclosure have been described herein for purposes of illustration, and that various modifications may be made without departing from the scope and spirit of the present disclosure By way of example, as shown in FIG. 21A, it may be possible to perform a control of reducing a duty ratio of the power modulation from an initial value (e.g., about 90% in the shown example) to a set value $D_s$ in step shape during a transition time $T_d$ immediately after a process is started. Alternatively, as depicted in FIG. 21B, it may be also possible to perform a control of reducing a duty ratio to the set value $D_s$ gradually (or in step shape) after a lapse of a certain elapse time $T_k$ immediately after the process is started. Here, in the aspect of performing a plasma process as desired under desired processing conditions, it may be desirable to shorten the elapse time $T_k$. Most desirably, the elapse time $T_k$ may be set to be zero ($T_k$=0) as in the above-described example embodiments.

The high frequency power RF1 of the high frequency power feed unit 33 suitable for plasma generation is described to be applied to the susceptor (lower electrode) 16 in the above-described example embodiments. However, it may be also possible to apply the high frequency power RF1 to the upper electrode 46.

The example embodiments may not be limited to the capacitively coupled plasma etching apparatus but may also be applicable to a certain capacitively coupled plasma processing apparatus configured to perform various plasma processes such as plasma CVD, plasma ALD, plasma oxidation, plasma nitrification, sputtering, and the like. Further, the processing target substrate may not be limited to the semiconductor wafer, but various types of substrates for a flat panel display, an organic EL or a solar cell, or a photo mask, a CD substrate, a printed circuit board may also be used.

EXPLANATION OF CODES

10: Chamber
16: Susceptor (lower electrode)
33, 35: High frequency power feed unit
36, 38: High frequency power supply
40, 42: Matching device
43, 45: High frequency transmission line
46: Upper electrode (shower head)
56: Processing gas supply source
72: Main controller
94A, 94B: Matching controller
96A, 96B: Impedance sensor

We claim:

1. A plasma processing method of generating plasma by an electric discharge of a processing gas between a first electrode and a second electrode which are provided to face each other within an evacuable processing vessel that accommodates therein a substrate to be processed, which is loaded into or unloaded from the processing vessel, and of performing a plasma process on the substrate held on the first electrode under the plasma, the plasma processing method comprising:
   performing a power modulation on a first power having a frequency suitable for plasma generation in a pulse shape such that a first period during which the first power is turned on or set to be a first level and a second period during which the first power is turned off or set to be a second level lower than the first level are alternately repeated at a regular pulse frequency in the plasma process; and
   setting a duty ratio in the power modulation of the first power to be an initial value for plasma ignition, and then, reducing the duty ratio from the initial value to a set value for the plasma process gradually or in a step shape during a preset transition time,
   wherein the reducing of the duty ratio in the power modulation of the first power is started at the same time of starting application of the first power to either one of the first electrode and the second electrode, and
   wherein the first power has a frequency of about 13.56 MHz or higher.

2. The plasma processing method of claim 1,
   wherein the initial value of the duty ratio is set to be about 85% to about 95%.

3. The plasma processing method of claim 1,
   wherein the transition time is set to be about 0.5 second to about 3.0 seconds.

4. The plasma processing method of claim 1, further comprising:
   applying a negative DC voltage to the second electrode,
   wherein an absolute value of the DC voltage during the second period is set to be larger than an absolute value of the DC voltage during the first period in synchronization with the power modulation of the first power.

5. The plasma processing method of claim 1, further comprising:
   applying a second power having a frequency suitable for ion attraction into the substrate from the plasma to the first electrode continuously at a preset constant power without performing the power modulation thereon,
   wherein the second power has a frequency of about 13.56 MHz or lower.

6. The plasma processing method of claim 5,
   wherein the applying of the second power to the first electrode is started after starting the reducing of the duty ratio in the power modulation of the first power.

7. The plasma processing method of claim 1, further comprising:
   applying a negative DC voltage to the second electrode only during the second period in synchronization with the power modulation of the first power.

8. The plasma processing method of claim 7,
   wherein the applying of the DC voltage to the second electrode is started after starting the reducing of the duty ratio in the power modulation of the first power.

9. The plasma processing method of claim 7, further comprising:
   applying a second power having a frequency suitable for ion attraction into the substrate from the plasma to the second electrode only during the first period in synchronization with the power modulation of the first power, wherein the second power has a frequency of about 13.56 MHz or lower.

10. The plasma processing method of claim 9, wherein the applying of the second power to the second electrode is started after starting the reducing of the duty ratio in the power modulation of the first power.

\* \* \* \* \*